United States Patent
Busch et al.

(10) Patent No.: US 7,153,778 B2
(45) Date of Patent: Dec. 26, 2006

(54) METHODS OF FORMING OPENINGS, AND METHODS OF FORMING CONTAINER CAPACITORS

(75) Inventors: Brett W. Busch, Boise, ID (US); Luan C. Tran, Meridian, ID (US); Ardavan Niroomand, Boise, ID (US); Fred D. Fishburn, Boise, ID (US); Yoshiki Hishiro, Boise, ID (US); Ulrich C. Boettiger, Boise, ID (US); Richard D. Holscher, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 37 days.

(21) Appl. No.: 10/783,843

(22) Filed: Feb. 20, 2004

(65) Prior Publication Data
US 2005/0186802 A1    Aug. 25, 2005

(51) Int. Cl.
H01L 21/3205 (2006.01)

(52) U.S. Cl. .................. 438/695; 438/703; 438/743; 438/744; 438/761; 438/778; 438/942; 438/946

(58) Field of Classification Search ................ 438/694, 438/695, 700, 702, 703, 743, 744, 761, 778, 438/942, 946, FOR. 127, FOR. 388, FOR. 401
See application file for complete search history.

(56) References Cited

U.S. PATENT DOCUMENTS

| | | | |
|---|---|---|---|
| 4,464,223 A | 8/1984 | Gorin | |
| 4,577,395 A | 3/1986 | Shibata | |
| 5,354,711 A | 10/1994 | Heitzmann et al. | |
| 5,413,898 A | 5/1995 | Kim et al. | |
| 5,523,258 A | 6/1996 | Petti et al. | |
| 5,525,534 A | 6/1996 | Ikemasu et al. | |
| 5,552,334 A * | 9/1996 | Tseng ..................... | 438/254 |
| 5,702,989 A | 12/1997 | Wang et al. | |
| 5,942,446 A * | 8/1999 | Chen et al. ............... | 438/734 |
| 5,963,814 A | 10/1999 | Walker et al. | |
| 6,037,213 A | 3/2000 | Shih et al. | |
| 6,074,979 A | 6/2000 | Hagemeyer et al. | |
| 6,080,531 A | 6/2000 | Carter et al. | |
| 6,121,653 A | 9/2000 | Juengling | |
| 6,190,989 B1 | 2/2001 | Roberts | |
| 6,238,850 B1 | 5/2001 | Bula et al. | |
| 6,248,508 B1 | 6/2001 | Murooka et al. | |

(Continued)

FOREIGN PATENT DOCUMENTS

DE     42 35 702 A1     4/1994

(Continued)

*Primary Examiner*—George R. Fourson
*Assistant Examiner*—Joannie Adelle Garcia
(74) *Attorney, Agent, or Firm*—Wells St. John P.S.

(57) ABSTRACT

A patterned mask can be formed as follows. A first patterned photoresist is formed over a masking layer and utilized during a first etch into the masking layer. The first etch extends to a depth in the masking layer that is less than entirely through the masking layer. A second patterned photoresist is subsequently formed over the masking layer and utilized during a second etch into the masking layer. The combined first and second etches form openings extending entirely through the masking layer and thus form the masking layer into the patterned mask. The patterned mask can be utilized to form a pattern in a substrate underlying the mask. The pattern formed in the substrate can correspond to an array of capacitor container openings. Capacitor structure can be formed within the openings. The capacitor structures can be incorporated within a DRAM array.

29 Claims, 27 Drawing Sheets

U.S. PATENT DOCUMENTS

| | | |
|---|---|---|
| 6,397,377 B1 | 5/2002 | Wang et al. |
| 6,410,437 B1 * | 6/2002 | Flanner et al. ............... 438/689 |
| 6,410,453 B1 | 6/2002 | Sandhu |
| 6,418,008 B1 | 7/2002 | Jost et al. |
| 6,455,439 B1 | 9/2002 | Sandhu |
| 6,475,921 B1 | 11/2002 | Sandhu |
| 6,479,391 B1 | 11/2002 | Morrow et al. |
| 6,528,238 B1 | 3/2003 | Seniuk et al. |
| 6,573,187 B1 * | 6/2003 | Chen et al. ................. 438/692 |
| 6,576,943 B1 | 6/2003 | Ishii et al. |
| 6,624,085 B1 | 9/2003 | Sandhu |
| 6,649,469 B1 | 11/2003 | Wilson |
| 6,713,407 B1 * | 3/2004 | Cheng et al. ................ 438/775 |
| 6,911,372 B1 * | 6/2005 | Son ........................... 438/397 |
| 6,933,193 B1 | 8/2005 | Wilson |
| 6,949,460 B1 * | 9/2005 | Wagganer et al. .......... 438/637 |
| 7,014,965 B1 * | 3/2006 | Liao et al. ..................... 430/30 |
| 2003/0073288 A1 * | 4/2003 | Pham et al. ................ 438/261 |
| 2004/0038541 A1 * | 2/2004 | Baier ......................... 438/703 |
| 2004/0219801 A1 * | 11/2004 | Oswald et al. .............. 438/778 |
| 2005/0106882 A1 * | 5/2005 | Chao et al. ................. 438/700 |

FOREIGN PATENT DOCUMENTS

JP    6-232112    8/1994

* cited by examiner

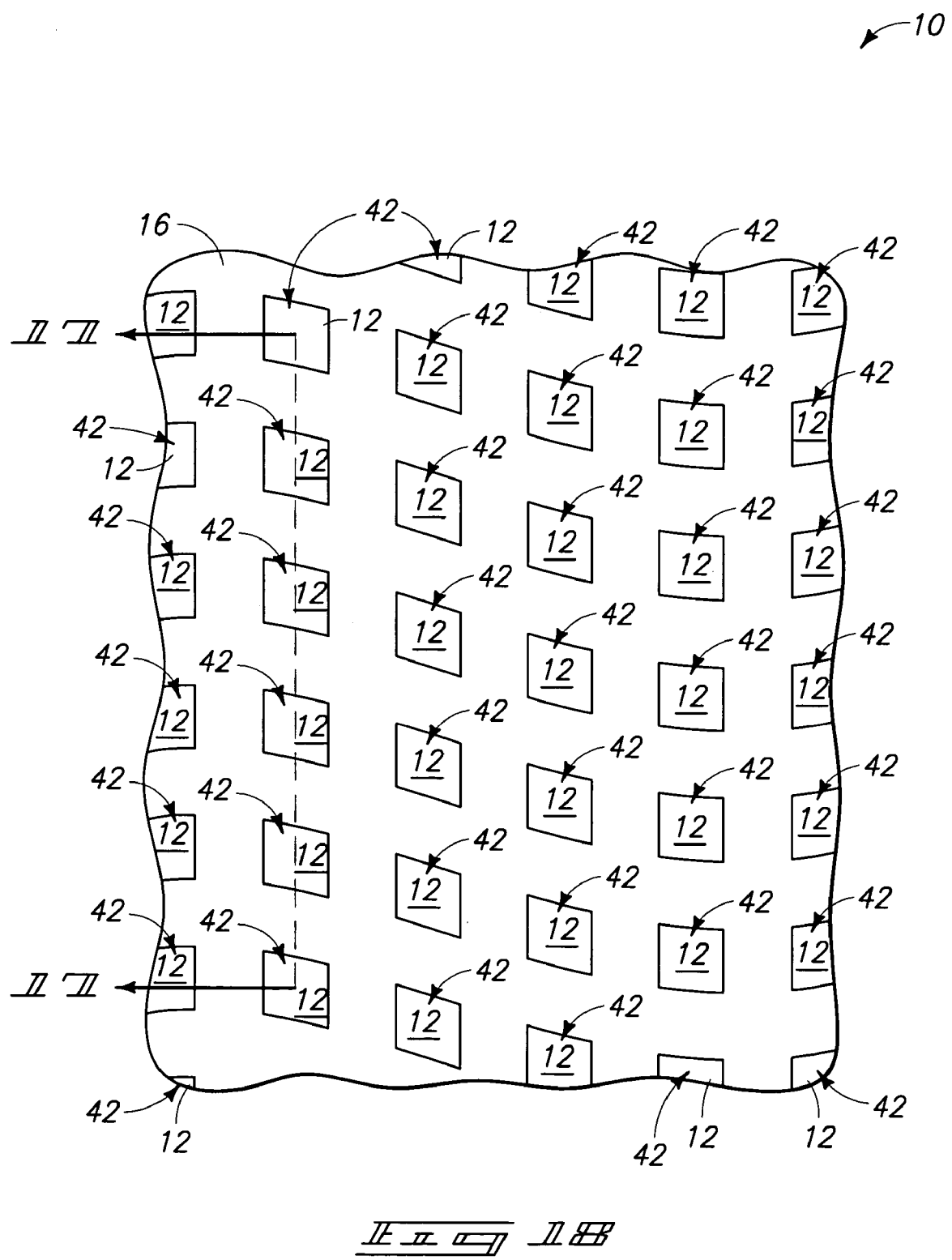
F I G 18

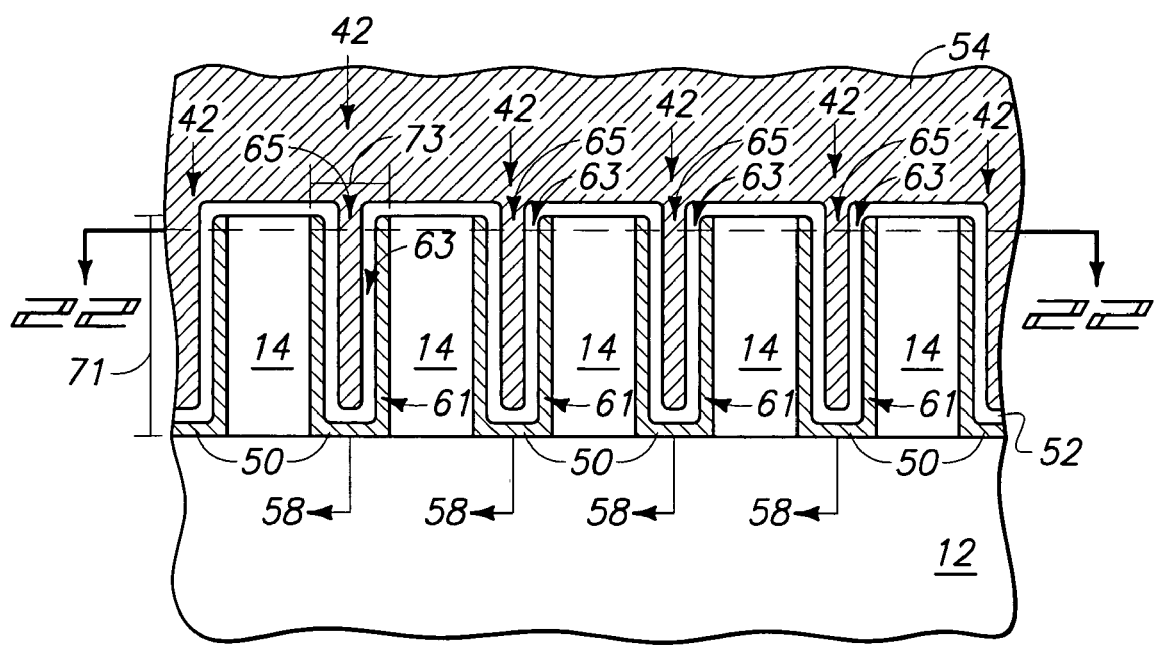
_FIG 21_

METHODS OF FORMING OPENINGS, AND METHODS OF FORMING CONTAINER CAPACITORS

TECHNICAL FIELD

The invention pertains to capacitor structures and dynamic random access memory (DRAM) arrays. The invention also pertains to methods of forming openings, and in particular aspects the invention pertains to methods of forming container capacitors associated with semiconductor constructions.

BACKGROUND OF THE INVENTION

Capacitor structures have many applications in integrated circuitry, including applications as memory storage devices in DRAM arrays. The capacitor devices can be fabricated as container devices, and can be formed within openings in an appropriate lattice material.

A common method utilized for forming openings is photolithographic processing. Specifically, a photosensitive material is provided over a layer and subsequently patterned with appropriate radiation (typically ultraviolet light). The patterned photoresist is then utilized as a mask during an etch of the underlying layer. The etch is conducted for an appropriate time to form openings either into the layer or extending entirely through the layer.

Problems with photolithographic processing are encountered as efforts are made to increase the density of devices associated with semiconductor substrates (i.e., as efforts are made to increase the scale of integration). For instance, the wavelength of light utilized to pattern photoresist can impart a limitation on the smallest size devices that can be fabricated with a particular photolithographic process. Efforts have been made to overcome such problem by extending photolithographic technologies to utilize smaller-wavelength light. For instance, the wavelength of light typically utilized for photolithographic processing has decreased from 365 nanometers to 248 nanometers, and then decreased from 248 nanometers to 193 nanometers, and now efforts are being made to utilize 157 nanometer wavelength radiation. However, regardless of the wavelength of radiation that is utilized for a particular photolithographic process, the radiation ultimately imposes a limitation on the smallest feature that can be directly patterned into a photosensitive material.

Another problem which can occur during photolithographic processing is that the shapes which can be formed by the processing are limited due to interference effects which occur as the dimensions of the patterned features approach the wavelength of radiation utilized to form the features. For instance, openings are typically elliptical or circular in shape, even though the actual opening formed in a reticle utilized during the photolithographic processing is typically rectangular, square, or otherwise polygonal.

The limitations on feature sizes and shapes that can achieved with photolithographic processing impart limitations on capacitor structure design. It is desired to overcome such limitations.

SUMMARY OF THE INVENTION

In one aspect, the invention includes a container capacitor structure. The structure has a container-shaped storage node. The container shape of the storage node has an open end and a periphery around the open end. The periphery comprises a substantially polygonal shape. A dielectric material extends into the container shape of the storage node. A capacitor electrode is over the dielectric material and capacitively separated from the storage node by at least the dielectric material.

In one aspect, the invention includes another capacitor structure. The structure comprises a semiconductor substrate and an insulative material over the semiconductor substrate. The structure further comprises a container opening extending into the insulative material. The container opening has a vertical dimension corresponding to a depth of the opening and a horizontal dimension orthogonal to the vertical dimension. The container opening has a substantially polygonal cross-section along the horizontal dimension. The structure additionally includes a first capacitor electrode, dielectric material and second capacitor electrode extending within the container opening.

In one aspect, the invention includes a DRAM array. The array includes a semiconductor substrate supporting a plurality of transistor devices. An insulative material is over the semiconductor substrate, and a plurality of container openings extend into the insulative material. Each of the container openings has a vertical dimension corresponding to a depth of the opening and a horizontal dimension orthogonal to the vertical dimension. Each of the container openings also has a substantially polygonal cross-section along the horizontal dimension, and the polygonal cross-section has at least four prominent sides. A first capacitor electrode, a dielectric material and a second capacitor electrode extend within the container openings to form a plurality of container capacitors of the DRAM array. The first capacitor electrodes are electrically connected to the transistor devices.

In one aspect, a method of forming an opening through a masking layer comprises utilization of at least two sequential photomasking steps. The photomasking steps are appropriate in combination to form the opening through the masking layer, but none of the photomasking steps is sufficient alone to form the opening through the masking layer. Each of the photomasking steps includes utilization of an etch to pattern the masking layer while a patterned photoresist mask is over the masking layer. Also, each of the photomasking steps utilizes a separate photoresist mask from the other photomasking steps.

In one aspect, the invention encompasses another method of forming openings. A substrate is provided which has a first photoresist thereover, and which has a masking layer beneath the first photoresist. A first pattern is formed within the first photoresist, and the first pattern is used during a first etch into the masking layer. The first etch extends to a depth in the masking layer that is less than entirely through the masking layer. A second photoresist is formed over the substrate, and a second pattern is formed within the second photoresist. The second pattern is used during an etch into the masking layer, and the second etch extends to a depth in the masking layer that is less than entirely through the masking layer. The combined depths to which the first and second etches extend into the masking layer is entirely through the masking layer, and the first and second etches form the masking layer into a patterned mask having a third pattern different from the first and second patterns. The patterned mask is subsequently used to pattern a region of the substrate beneath the patterned mask.

In one aspect, the invention encompasses a method of forming container capacitors. A semiconductor substrate is provided. An electrically insulative material is formed over the substrate. A pair of masking layers is formed over the electrically insulative material. The pair of masking layers are a first masking layer and a second masking layer, with the second masking layer being over the first masking layer and having a thickness. A first pattern is photolithographically formed over the second masking layer. The first pattern comprises a first series of trenches. A substantial reproduction of the first pattern is transferred into the second masking layer to a depth which extends less than entirely through the thickness of the second masking layer. After the substantial reproduction of the first pattern is transferred into the second masking layer, a second pattern is photolithographically formed over the second masking layer. The second pattern comprises a second series of trenches. At least some of the trenches of the second series cross locations of at least some of the trenches of the first series. A substantial reproduction of the second pattern is transferred into the second masking layer to a depth which extends less than entirely through the thickness of the second masking layer. The combined depths to which the substantial reproductions of the first and second patterns are transferred into the second masking layer extend entirely through the thickness of the second masking layer. The combined transferring of the substantial reproductions of the first and second patterns into the second masking layer forms the second masking layer into a patterned mask over the first masking layer. The patterned mask has a capacitor container pattern which defines capacitor container locations as regions where overlap occurs between trenches of the second series and trenches of the first series. A substantial reproduction of the capacitor container pattern is transferred from the patterned mask into the first masking layer. A substantial reproduction of the capacitor container pattern is subsequently transferred from the first masking layer into the electrically insulative material to form capacitor containers within the electrically insulative material. A first capacitor electrode, dielectric material, and second capacitor electrode are formed to extend within the capacitor containers to form capacitor structures.

BRIEF DESCRIPTION OF THE DRAWINGS

Preferred embodiments of the invention are described below with reference to the following accompanying drawings.

FIGS. 17 and 18 correspond to a cross-sectional view and top view, respectively, of a semiconductor wafer fragment at a processing stage subsequent to that of FIGS. 15 and 16. The cross-section of FIG. 17 is shown along the line 17—17 of FIG. 18.

FIG. 21 is a view of the FIG. 19 cross-section shown at a processing stage subsequent to that of FIG. 19.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

The invention encompasses methods in which two or more sequential photomasking steps are utilized to form openings extending entirely through a layer. None of the photomasking steps by itself forms an opening deep enough to penetrate entirely through the layer, but instead a combination of the photomasking steps forms the openings which extend entirely through the layer. The openings can be utilized in numerous semiconductor applications, including, for example, formation of capacitor containers.

In some aspects, the invention pertains to container capacitor structures, and to integrated circuit constructions utilizing container capacitor structures. The container structures include container-shaped storage nodes having a periphery comprising a substantially polygonal shape. The polygonal-shaped storage nodes of the present invention can provide numerous advantages. For instance, capacitors are typically formed within allocated regions over a semiconductor substrate. The polygonal shape of storage nodes formed in accordance with particular aspects of the present invention can increase peripheral capacitive area of a capacitor relative to capacitors having other shapes of storage nodes, and in particular aspects can substantially maximize the peripheral capacitive area of a capacitor of the present invention. The peripheral capacitive area of a capacitor is linked to the capacitance that can ultimately be obtained from the capacitor, with larger peripheral capacitive areas leading to larger capacitance. Accordingly, maximization of the peripheral capacitive area of a capacitor can lead to maximization of the capacitance achievable from a capacitor formed within an allocated region over a semiconductor substrate. Thus, the invention cannot only substantially maximize the peripheral capacitive area of capacitors formed within allocated regions over a semiconductor substrate, but also can, in particular aspects, substantially maximize the capacitance achievable from an allocated region over a semiconductor substrate.

Figure 1:
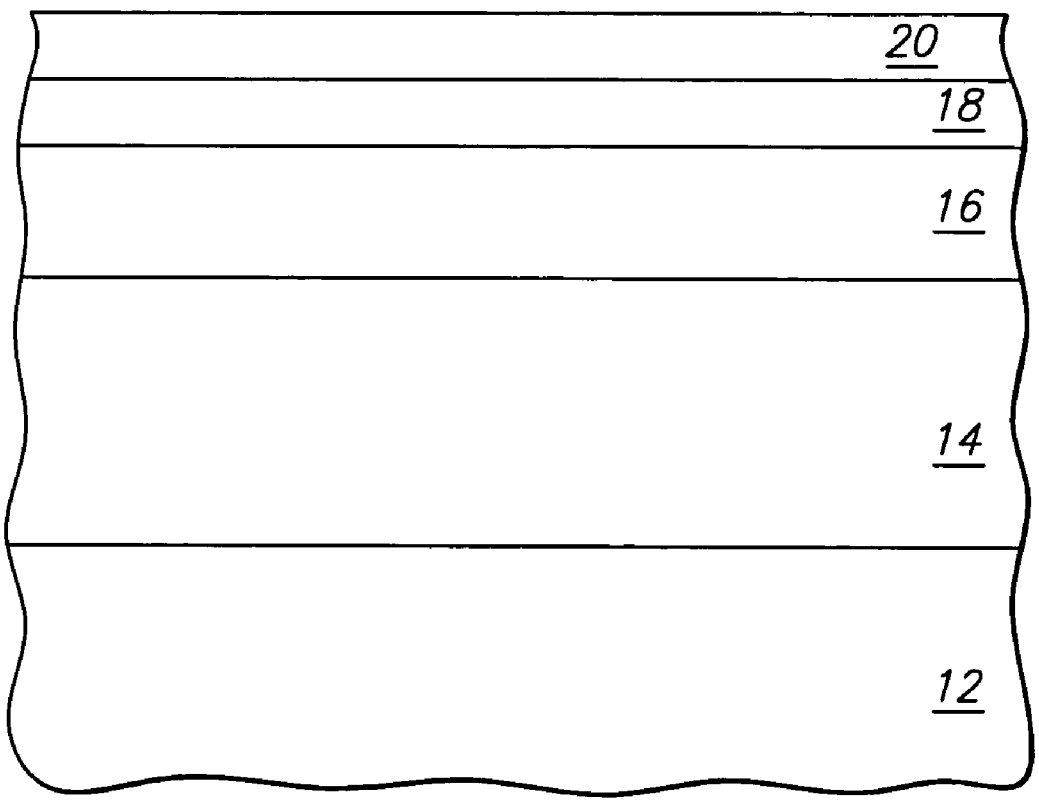
FIGS. 1 and 2 are a diagrammatic cross-sectional view and top view, respectively, of a semiconductor wafer fragment at a preliminary processing stage of an exemplary method which can be utilized in aspects of the present invention. The FIG. 1 cross-section extends along the line 1—1 of FIG. 2.
Figure 2:
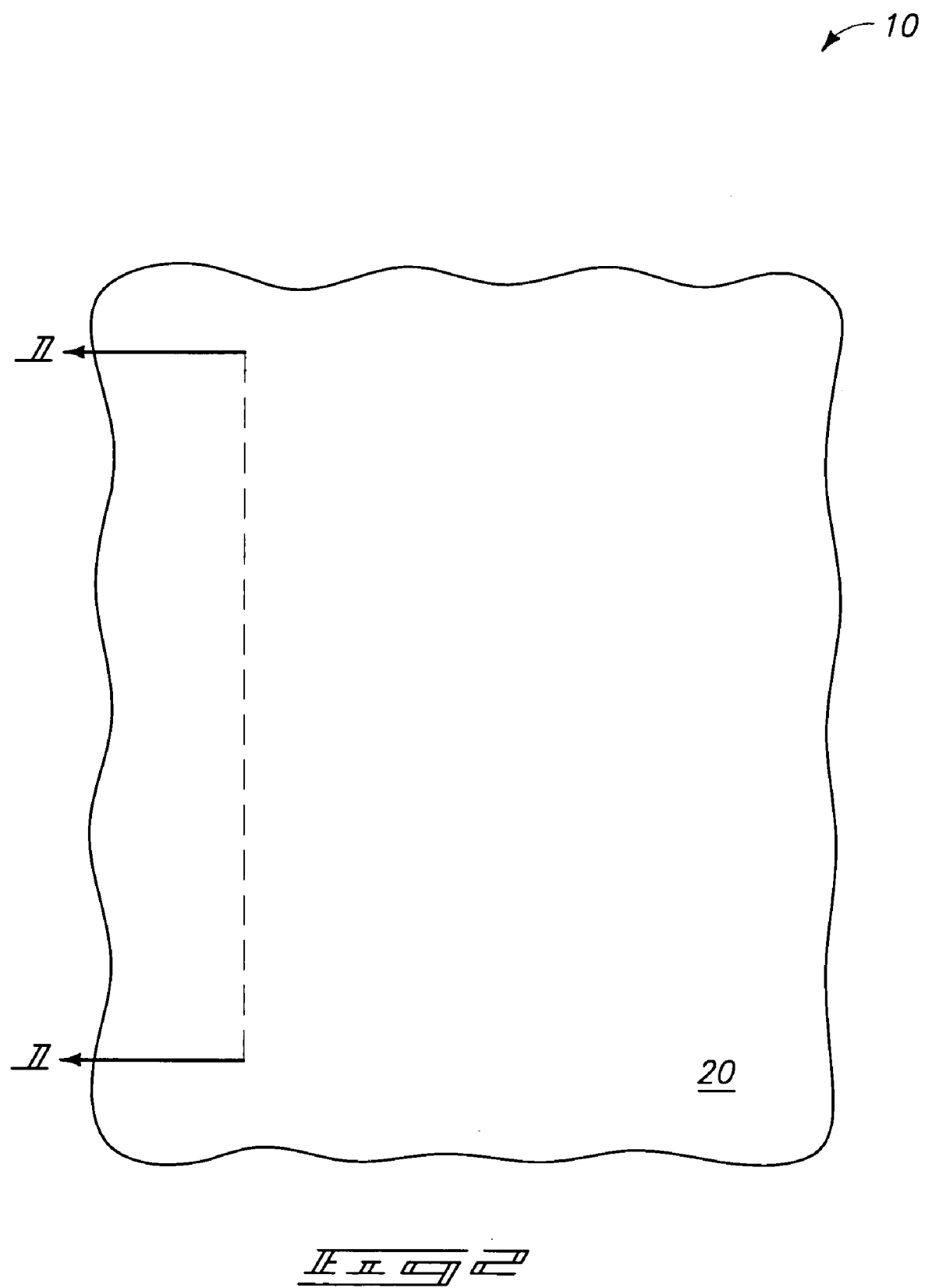

An exemplary method and application of the present invention is described with reference to FIGS. 1–22. Referring initially to FIGS. 1 and 2, a semiconductor construction 10 is illustrated at a preliminary processing stage. Construction 10 includes a semiconductor substrate (or base) 12. Substrate 12 can comprise, for example, a monocrystalline silicon wafer. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

An electrically insulative material 14 is formed over substrate 12. Material 14 can comprise any suitable electrically insulative material, including, for example, materials comprising silicon and oxygen. In particular aspects of the invention, material 14 will comprise, consist essentially of, or consist of a doped silicon oxide, such as, for example, borophosphosilicate glass (BPSG) or phosphosilicate glass (PSG). Capacitor container openings (discussed below) are ultimately formed within material 14. Material 14 can thus be considered a scaffold for the capacitor containers, and can be referred to as a container-scaffold-material. Material 14 can consist essentially of, or consist of a doped silicon oxide, and can be formed to a thickness of, for example, from about 5,000 Å to about 30,000 Å. Material 14 can sometimes be referred to as a first material to distinguish the material from other materials formed over material 14. In such aspects, substrate 12 can be considered a semiconductor base which supports first material 14.

A second material 16 is formed over first material 14. Second material 16 preferably comprises a material to which the material 14 can be selectively etched. In particular aspects, material 16 comprises a spin-on material. In some aspects, material 16 comprises, consists essentially of, or consists of amorphous carbon.

Material 16 can be referred to as a masking layer, in that material 16 is utilized to form a patterned mask which ultimately is utilized for patterning layer 14. In some aspects, layer 14 can comprise a doped oxide and material 16 can comprise amorphous carbon, and material 16 can be formed to a thickness of, for example, from about 1,000 Å to about 10,000 Å. Layer 16 can be referred to as a first masking layer to distinguish layer 16 from other masking layers (discussed below) which can be formed over layer 16.

A layer 18 is formed over the above-described layer 16. Layer 18 corresponds to a masking layer, and can be referred to as a second masking layer in particular embodiments to distinguish layer 18 from the first masking layer 16. Layer 18 can comprise, for example, silicon and nitrogen, and in some aspects, layer 18 can comprise, consist essentially of, or consist of silicon, oxygen and nitrogen. Layer 18 can, for example, correspond to silicon oxynitride, and can be a deposited antireflective coating (DARC). Layer 18 can be formed to a thickness of, for example, from about 300 Å to about 5,000 Å.

A photoresist 20 is formed over layer 18. Photoresist 20 can be referred to as a first photoresist to distinguish the photoresist from other photoresists (discussed below) formed subsequent to resist 20. Photoresist 20 is shown formed directly against (i.e., in physical contact with) layer 18, which in turn is formed directly against layer 16, which in turn is formed directly against layer 14, which in turn is formed directly against substrate 12. It is to be understood that other layers (not shown) could be utilized in addition to the shown layers 14, 16, 18 and 20, and further that one or more of the shown layers 14, 16 and 18 could be eliminated. Additionally, it is to be understood that the term "substrate" as utilized in this disclosure can, for example, encompass the base 12 separately from layers formed over the base, and can encompass various combinations of base 12 with layers formed over the base.

The photoresist 20 is the only visible material in the top view of FIG. 2.

Figure 3:
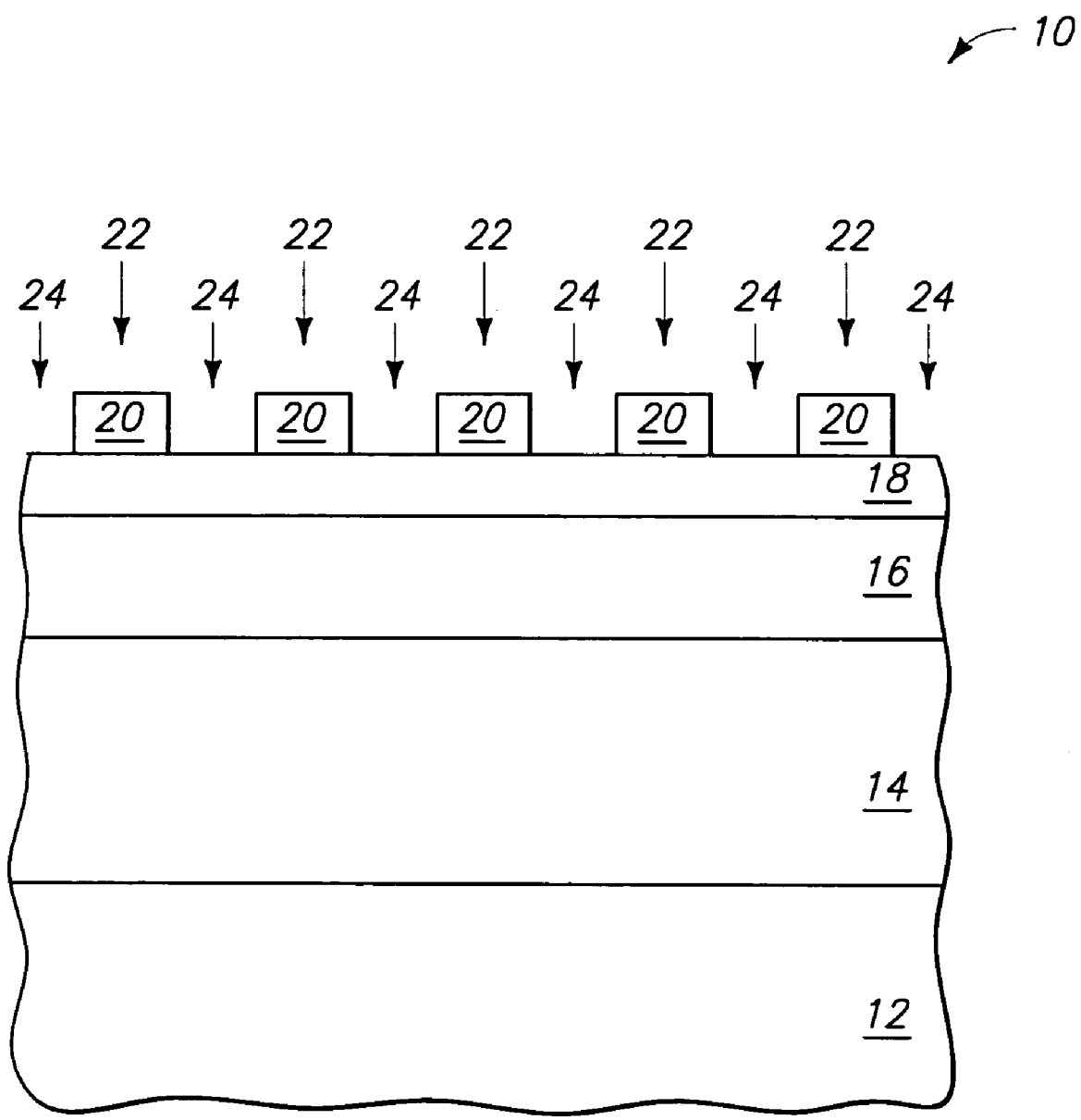
FIGS. 3 and 4 are a cross-sectional view and top view, respectively, of the fragments of FIGS. 1 and 2 shown at a processing stage subsequent to that of FIGS. 1 and 2, with the cross-section of FIG. 3 shown along the line 3—3 of FIG. 4.
Figure 4:
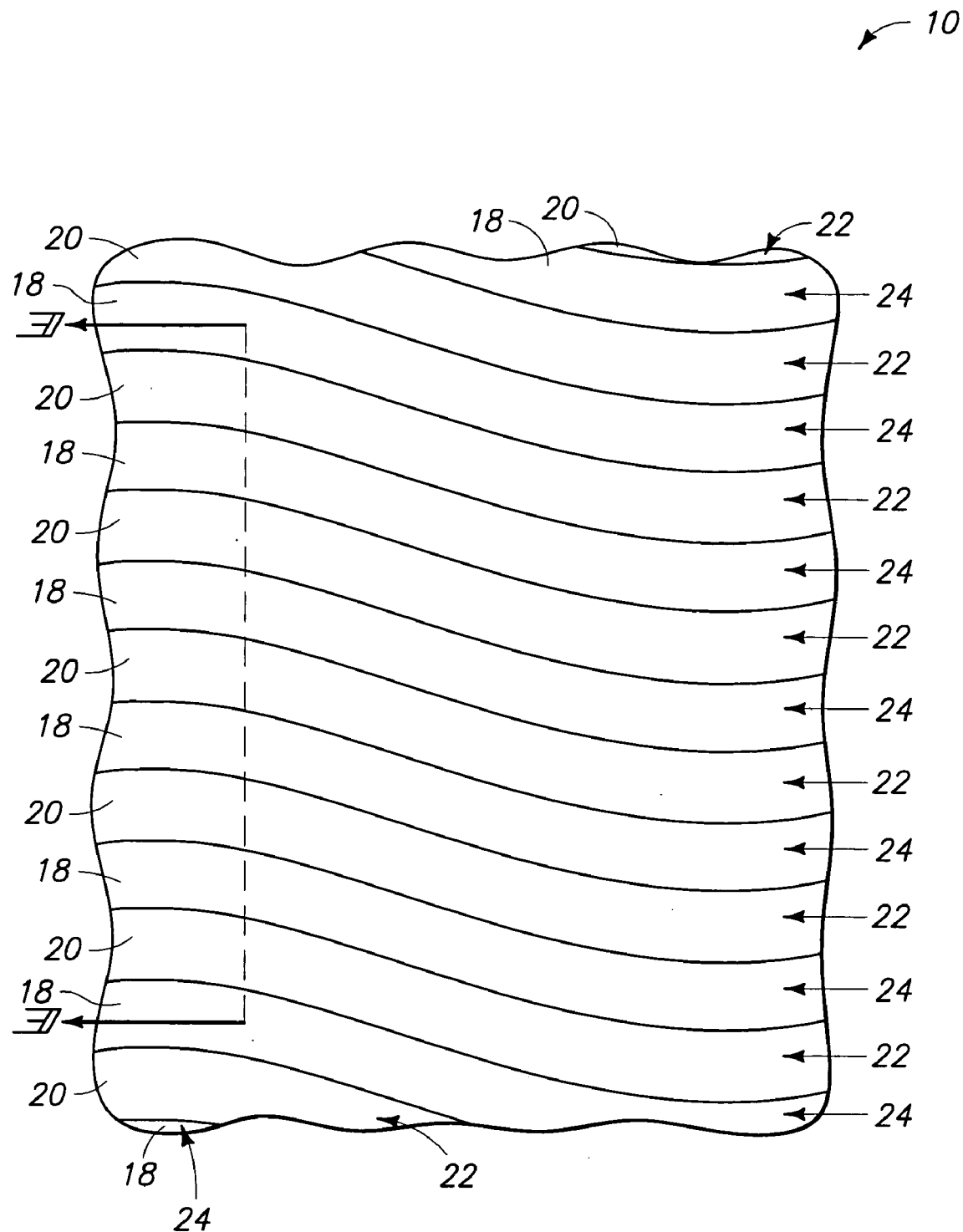

Referring next to FIGS. 3 and 4, photoresist 20 is patterned into a series of upwardly-projecting features 22. A plurality of gaps 24 extend between the features 22. The gaps 24 can be considered downwardly-projecting features defined by, or comprised by, the pattern of patterned photoresist 20. Downwardly-projecting features 24 can be referred to as first features to distinguish the features from other downwardly-projecting features (discussed below) formed in subsequent processing. The top view of FIG. 4 shows that features 24 are substantially linear, and are in the form of trenches. The features 24 of the aspect shown in FIGS. 3 and 4 are in the form of wavy lines, but it is to be understood that the downwardly-projecting features can be formed in other shapes, including, for example, straight lines or substantially straight lines. The series of downwardly-projecting features formed by the photolithographic processing of FIGS. 1–4 can be referred to as a first series of downwardly-projecting features to distinguish the features from one or more other series of downwardly-projecting features formed in subsequent processing (discussed below).

Figure 5:
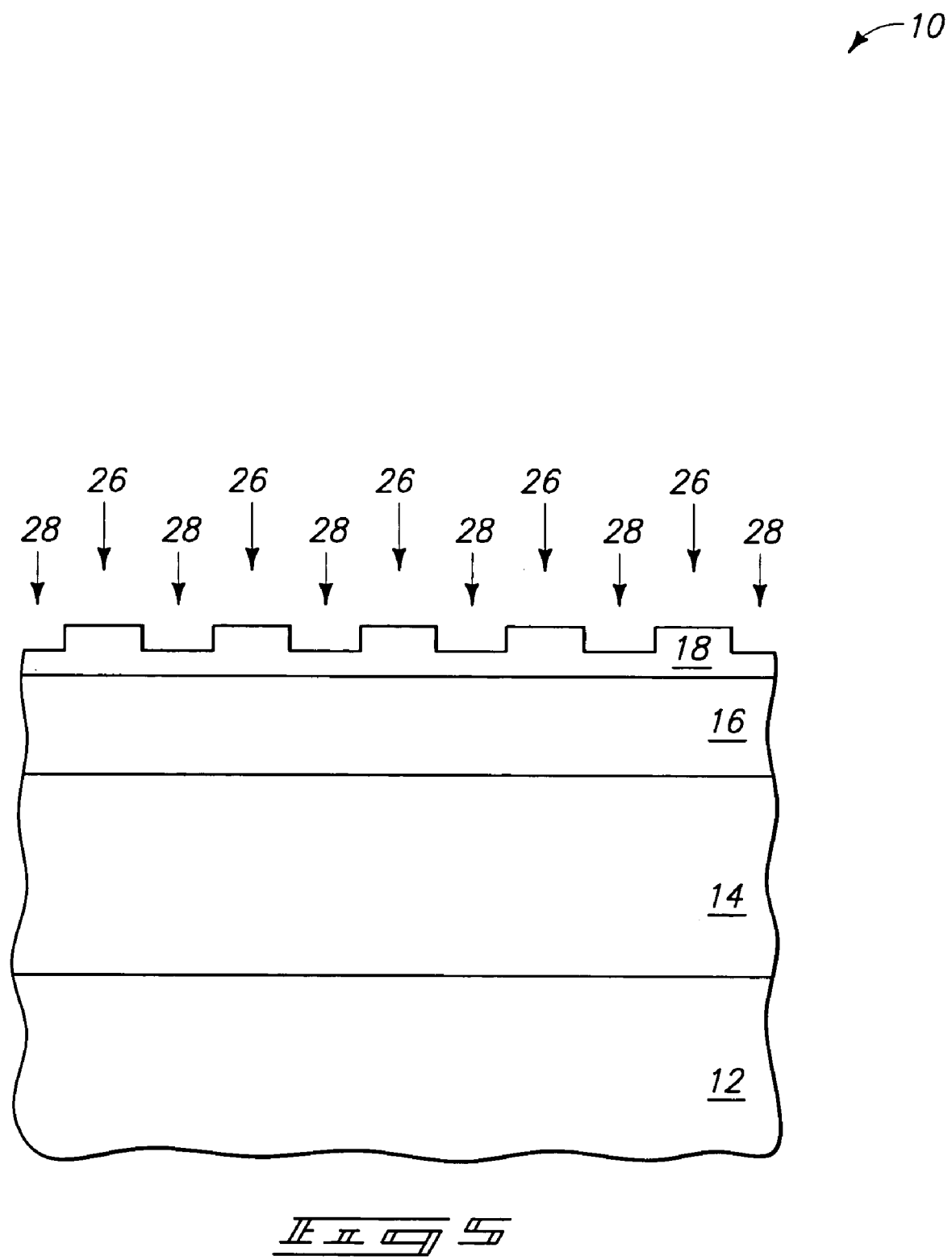
FIGS. 5 and 6 are a cross-sectional view and top view, respectively, of the fragments of FIGS. 1 and 2 shown at a processing stage subsequent to that of FIGS. 3 and 4. The cross-section of FIG. 5 extends along the line 5—5 of FIG. 6.
Figure 6:
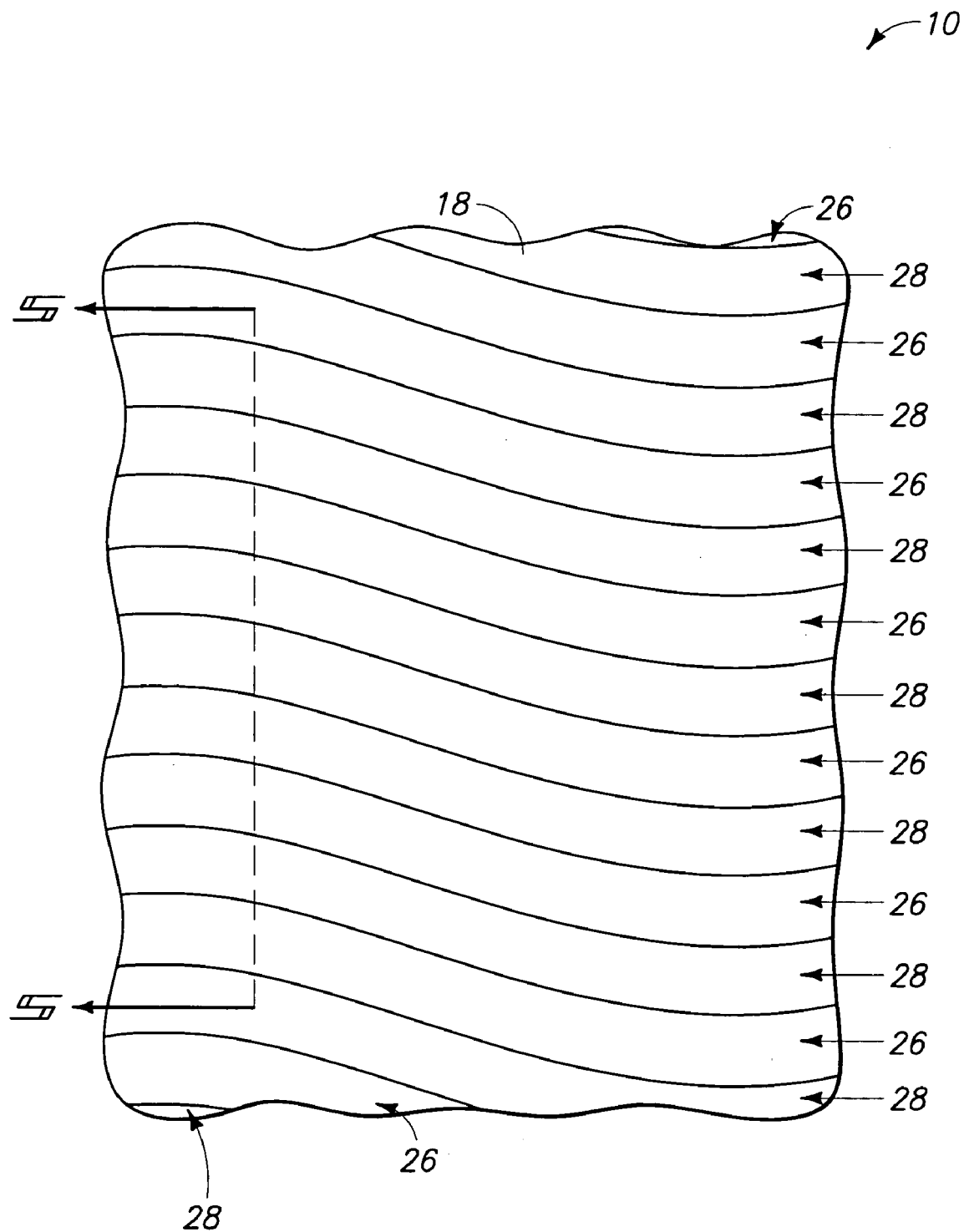

Referring next to FIGS. 5 and 6, the patterned photoresist 20 (FIGS. 3 and 4) is utilized during an etch of masking layer 18. Specifically, a pattern from the patterned material 20 of FIGS. 3 and 4 is substantially reproduced in layer 18 so that upwardly-projecting features 26 and downwardly-projecting features 28 are formed within layer 18. The pattern of the patterned resist of FIGS. 3 and 4 is described as being "substantially reproduced" within layer 18 to indicate that the pattern is reproduced within layer 18 within the tolerances imposed by particular etching conditions. The etch of layer 18 can be any suitable etch.

The downwardly-projecting features 28 formed within layer 18 are in locations defined by the trenches 24 of FIGS. 3 and 4. In some aspects, the downwardly-projecting features 28 of FIGS. 5 and 6 can be considered to be extensions of the trenches 24 of FIGS. 3 and 4.

The lowermost regions of downwardly-projecting features 28 correspond to a depth to which an etch into layer 18 extends. Such depth is less than entirely through masking layer 18. As will become apparent from the discussion that follows, the methodology described herein encompasses processing in which openings are extended through layer 18 with a combination of multiple photomasking steps. Each photomasking step comprises etching a pattern into the masking layer 18 while a patterned photoresist mask is over the masking layer, and each photomasking step utilizes a separate photoresist mask from the others. The depth to which downwardly-projecting features 28 are extended into layer 18 will preferably be sufficient so that openings will be extended entirely through layer 18 at the conclusion of the final photomasking step that is utilized in the combination of photomasking steps. Accordingly, if two photomasking steps are to be utilized, downwardly-projecting features 28 will typically be extended at least about halfway through layer 18. However, it is to be understood that the methodology can also encompass aspects in which the etching utilized in various photomasking steps extends to substantially different depths relative to one another. Accordingly, two photomasking steps could ultimately be utilized to form openings extending entirely through layer 18, and one of the photomasking steps could form openings extending substantially less than halfway into layer 18 while another of the photomasking steps forms openings extending substantially more than halfway through layer 18.

Figure 7:
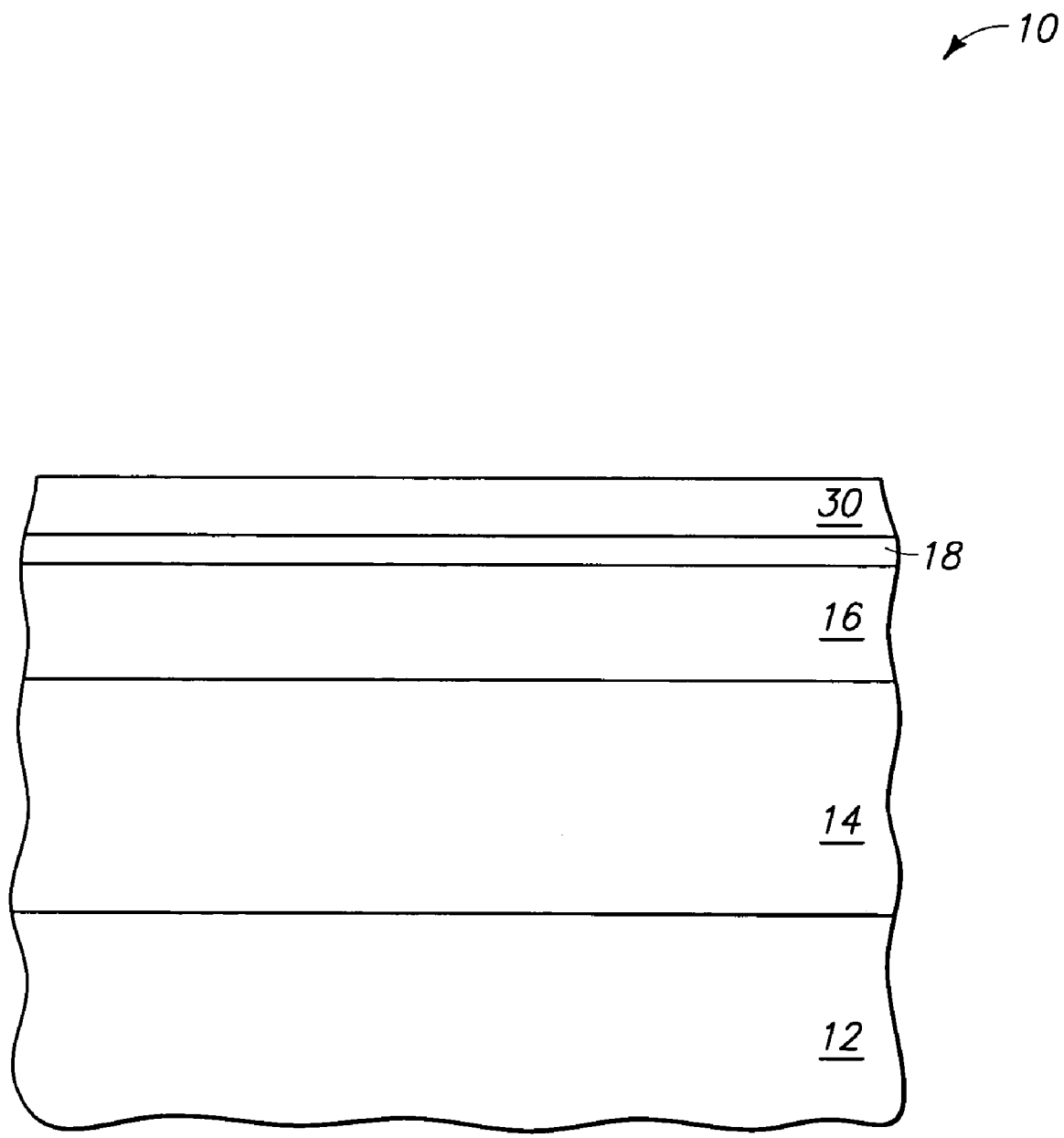
FIGS. 7 and 8 are a cross-sectional view and top view, respectively, of semiconductor wafer fragments at a processing stage subsequent to that of FIGS. 4 and 5. The top view of FIG. 8 corresponds to the top view of FIGS. 2, 4 and 6; and the fragmentary view of FIG. 7 corresponds to a view which is substantially orthogonal to the fragmentary views of FIGS. 1, 3 and 5. The fragmentary view of FIG. 7 is shown along the line 7—7 of FIG. 8.
Figure 8:
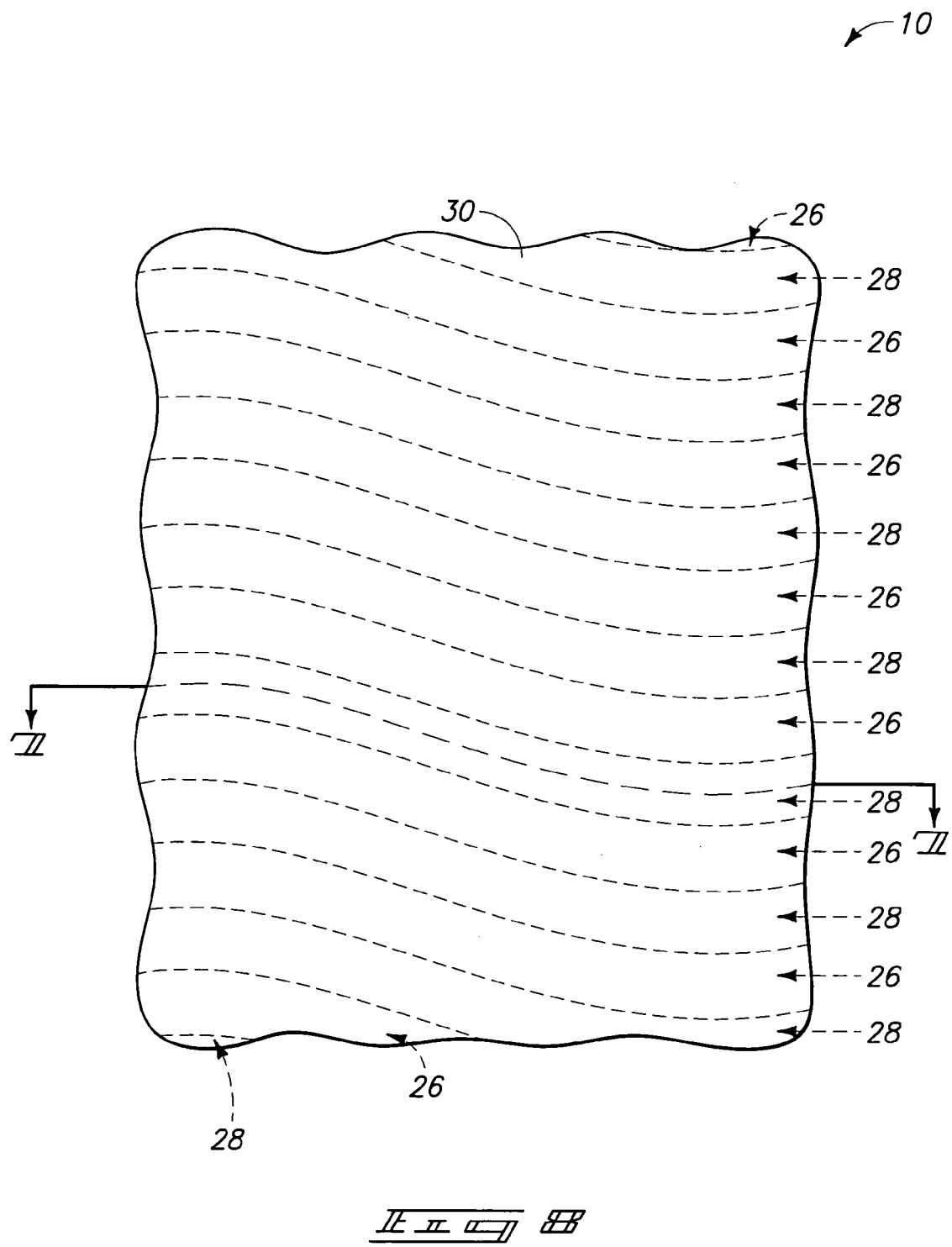

Referring next to FIGS. 7 and 8, a second photoresist 30 is formed over the patterned masking layer 18 of FIGS. 5 and 6. Upwardly-projecting features 26 and downwardly-projecting features 28 of FIGS. 5 and 6 are shown in phantom view in FIG. 8 to indicate that the features are beneath photoresist 30, and to show that the cross-section of FIG. 7 extends along one of the trenches 28. The cross-section of FIG. 7 is shown along a view which substantially orthogonal to the view utilized for the cross-sections of FIGS. 1, 3 and 5 to assist in describing the subsequent patterning of layers 30 and 18 in the discussion that follows.

Figure 9:
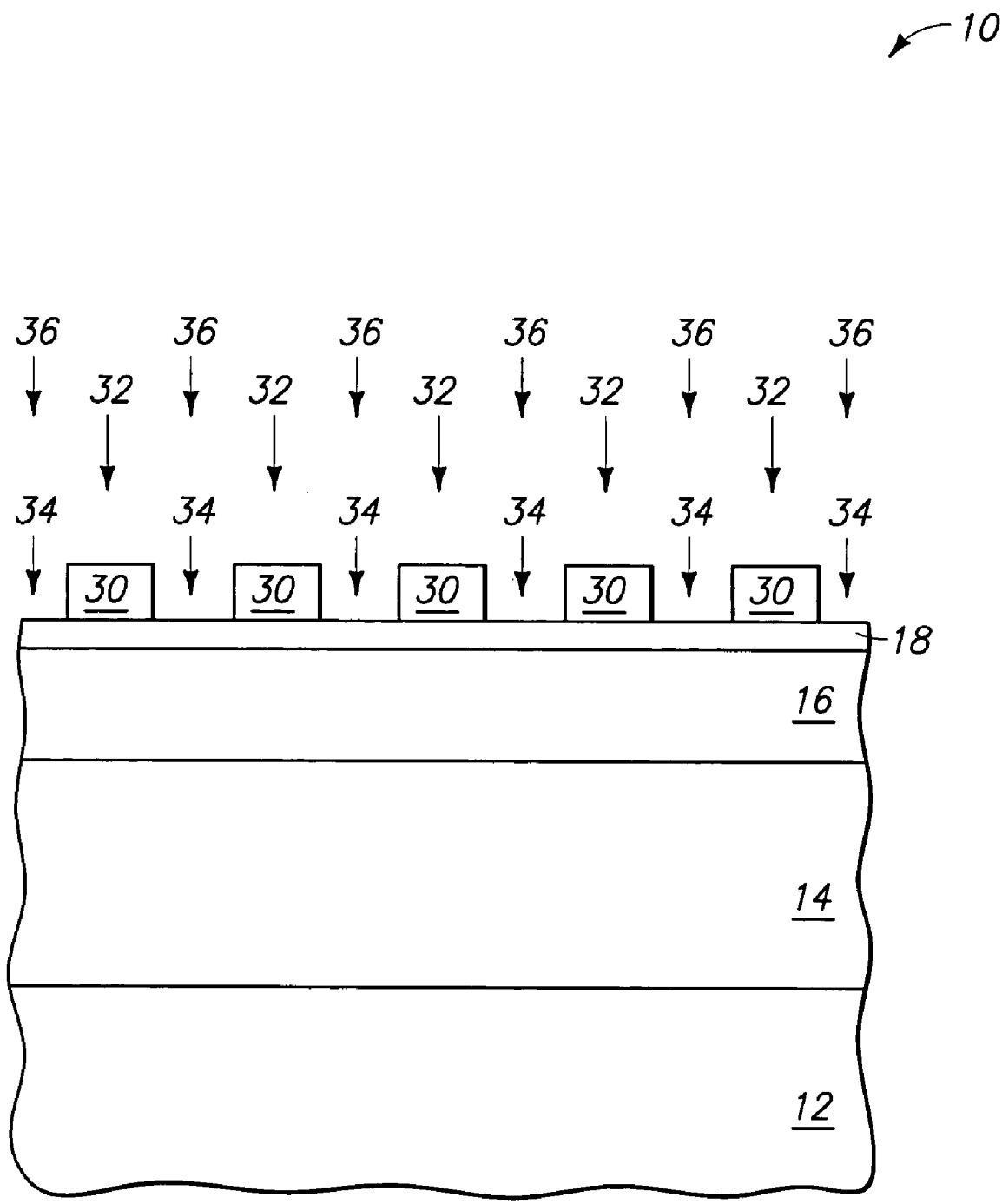
FIGS. 9 and 10 correspond to a cross-sectional view and top view, respectively, of a semiconductor wafer fragment shown at a processing stage subsequent to that of FIGS. 7 and 8, with the cross-sectional view of FIG. 9 extending along the line 9—9 of FIG. 10.
Figure 10:
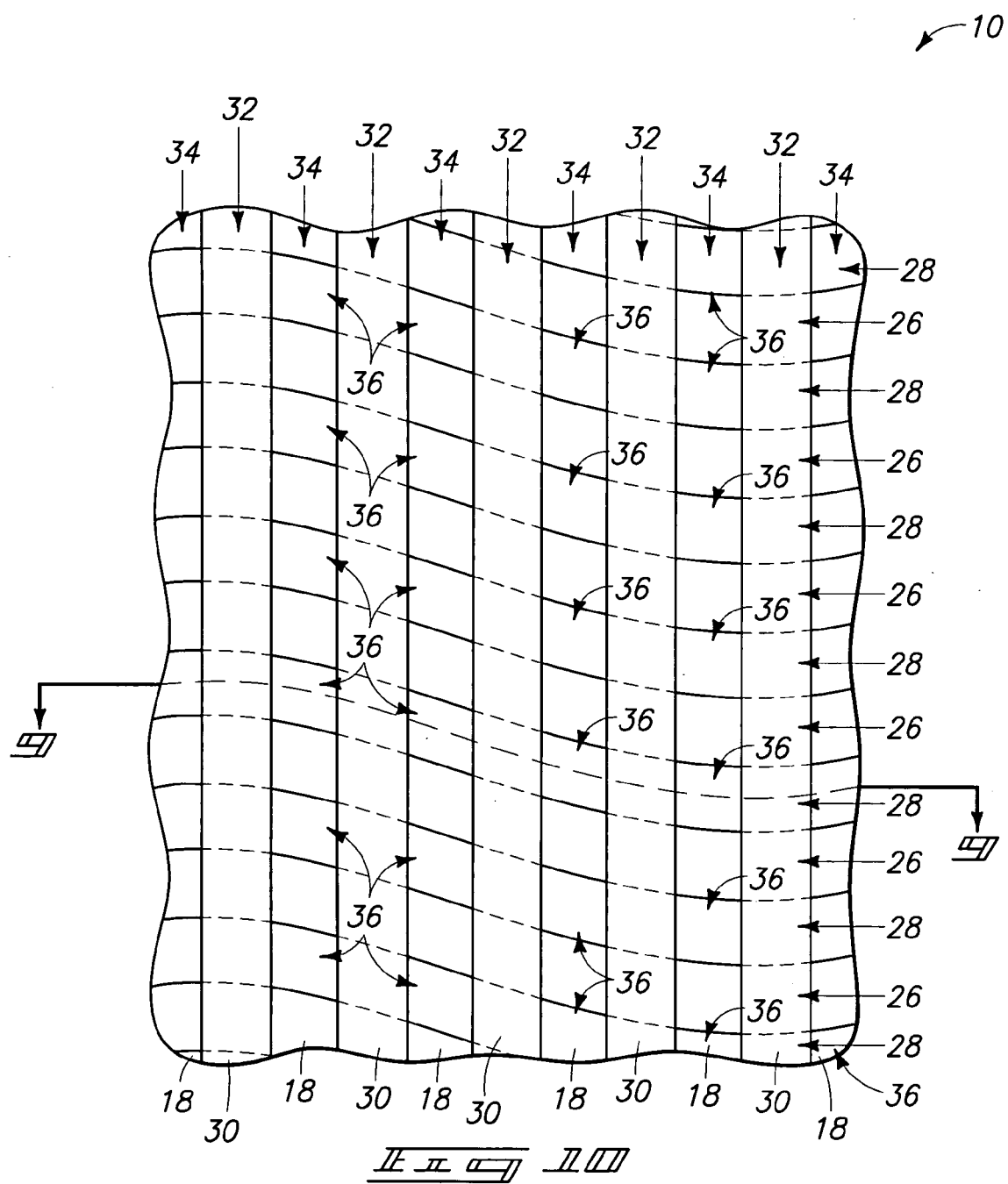

Referring to FIGS. 9 and 10, photoresist 30 is patterned into a plurality of upwardly-projecting features 32. A plurality of downwardly-projecting features 34 (or trenches) are defined as regions between the upwardly-projecting features 32. Trenches 34 are substantially linear, and are shown as straight lines. Trenches 34 are substantially orthogonal to the trenches 28 formed previously in material 18, or in other words are substantially orthogonal to the direction of the first series of trenches 24 (FIGS. 3 and 4) that had been formed previously utilizing patterned resist 20. The patterned resist 20 of FIGS. 3 and 4 can thus be considered to define a first pattern comprising a series of trenches (or downwardly-projecting features) 24, and patterned resist 30 of FIGS. 9 and 10 can be considered to define a second pattern comprising a second series of trenches (or downwardly-projecting features) 34 which extend at substantially right angles (or substantially orthogonally) to the locations of the first series of trenches. Although the second series of trenches are shown to extend at approximately right angles to the locations of the first series of trenches, it is to be understood that other methodology can be utilized in which the trenches of the second series are not at approximately right angles to the locations of the trenches of the first series.

The crossing of upwardly-extending features 32 of photoresist 30 relative to upwardly-extending features 26 that have previously been formed within masking layer 18 can be seen in FIG. 10 to form polygonal regions 36 as wells between the upwardly-projecting features 26 and upwardly-projecting features 36. Alternatively, the wells can be considered to be formed at regions where downwardly projecting features 28 overlap downwardly projecting features 34.

Figure 11:
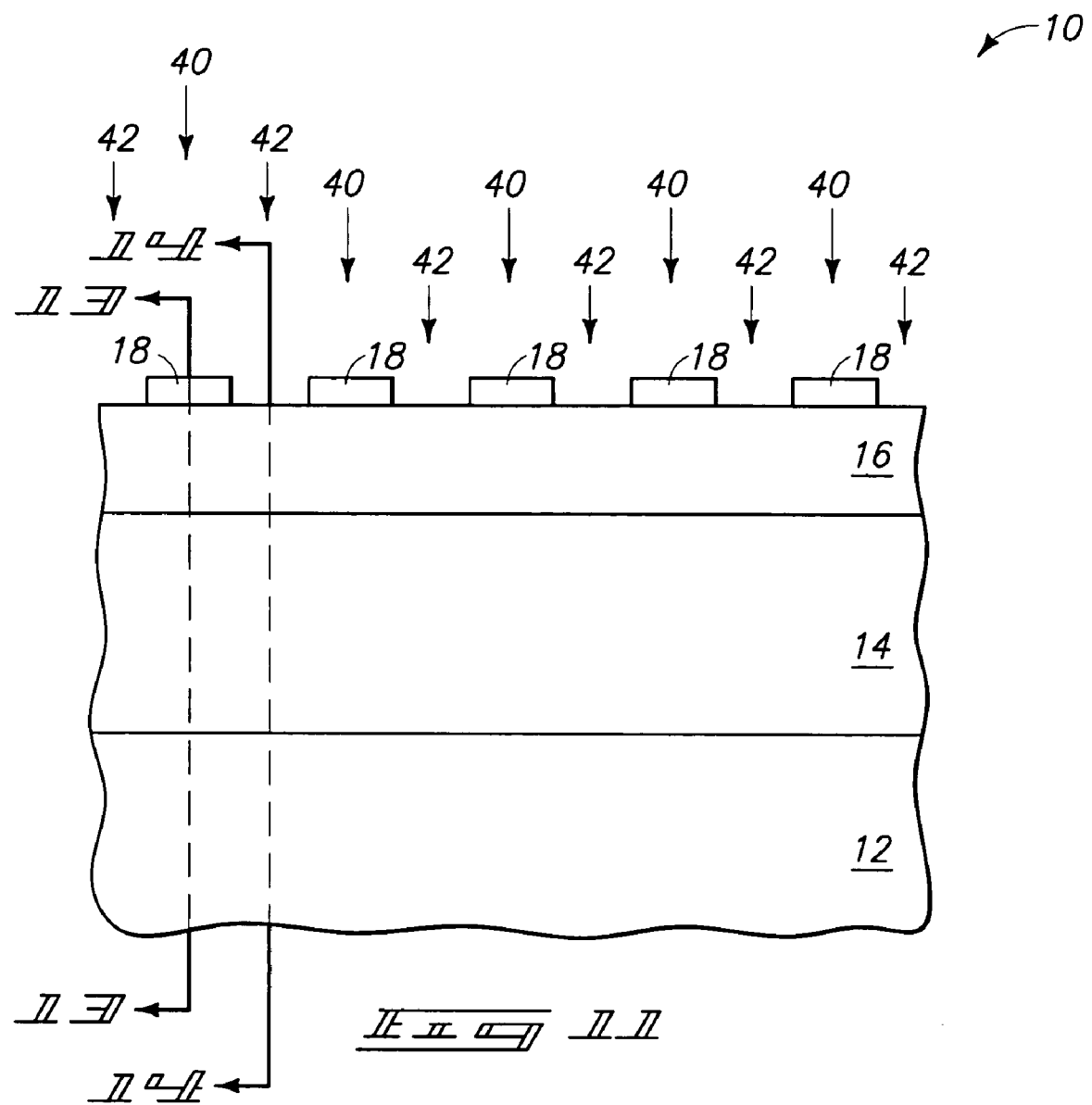
FIGS. 11, 12, 13 and 14 correspond to cross-sectional views (FIGS. 11, 13 and 14) and a top view (FIG. 12) of a semiconductor wafer fragment shown at a processing stage subsequent to that of FIGS. 9 and 10. The cross-sections of FIGS. 11, 13 and 14 are shown along the lines 11—11, 13—13 and 14—14, respectively, of FIG. 12; the cross-section of FIG. 11 is shown along the lines 11—11 of FIGS. 13 and 14; and the cross-sections of FIGS. 13 and 14 are shown along the lines 13—13 and 14—14 of FIG. 11.
Figure 12:
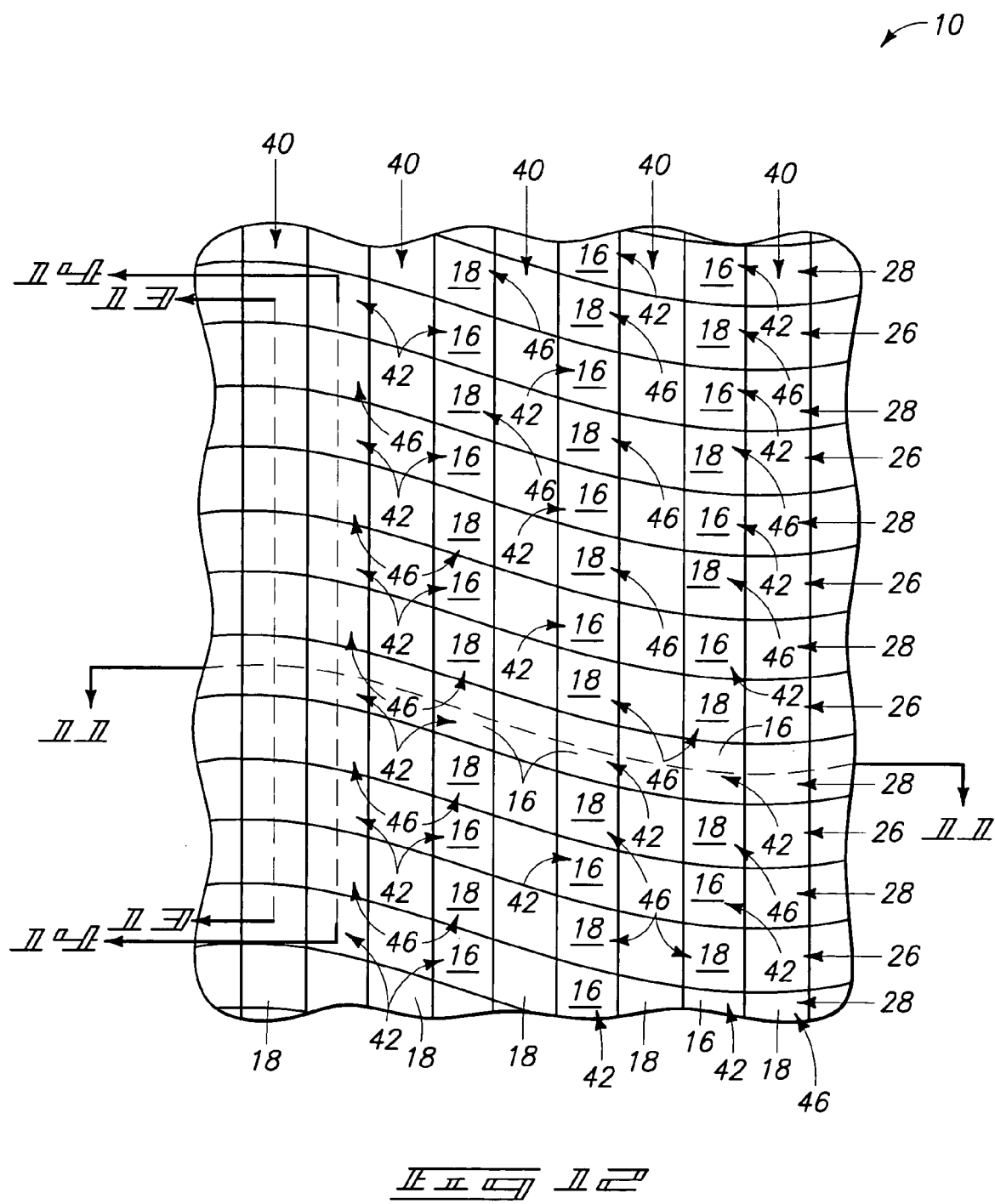
Figure 13:
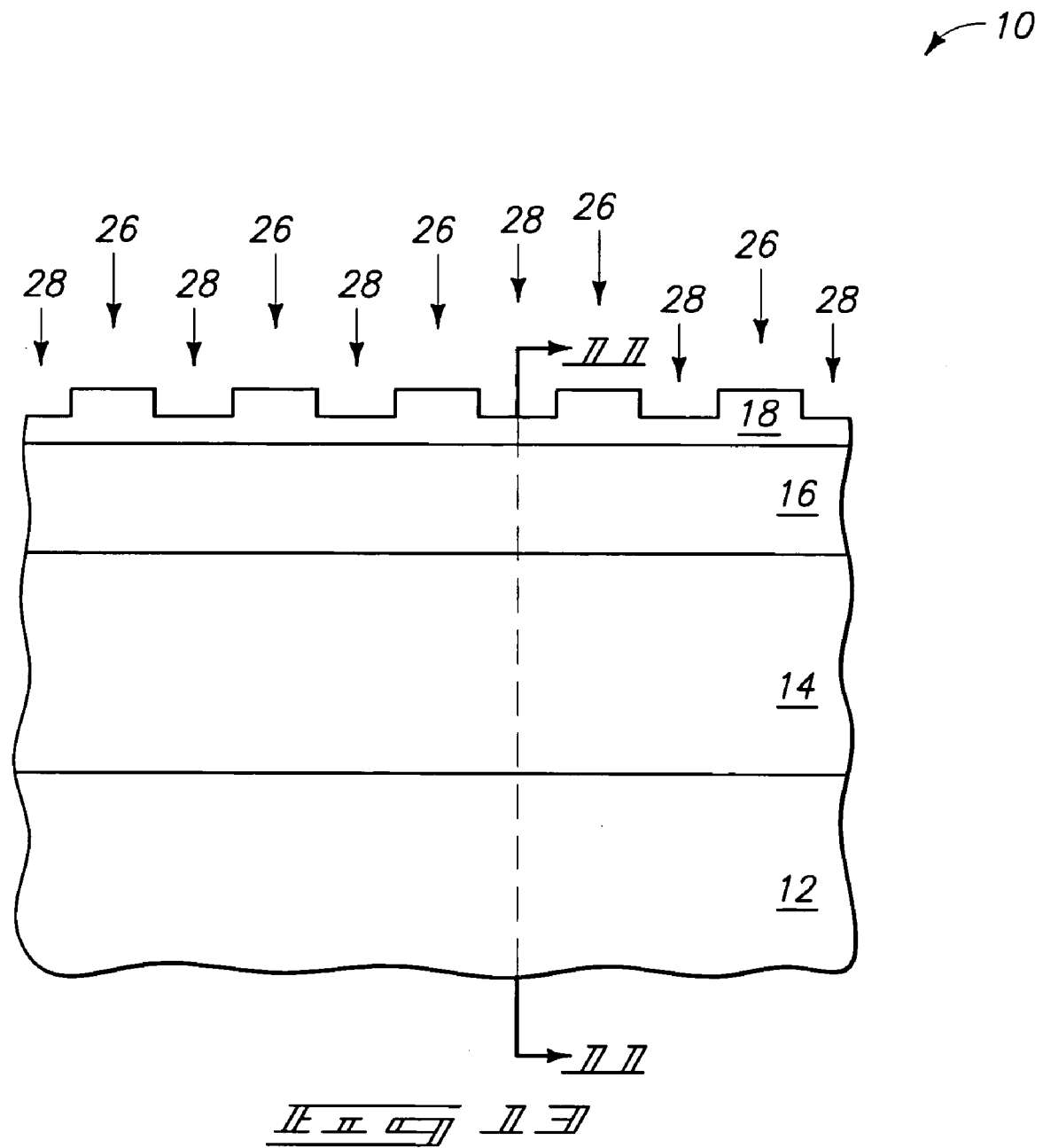
Figure 14:
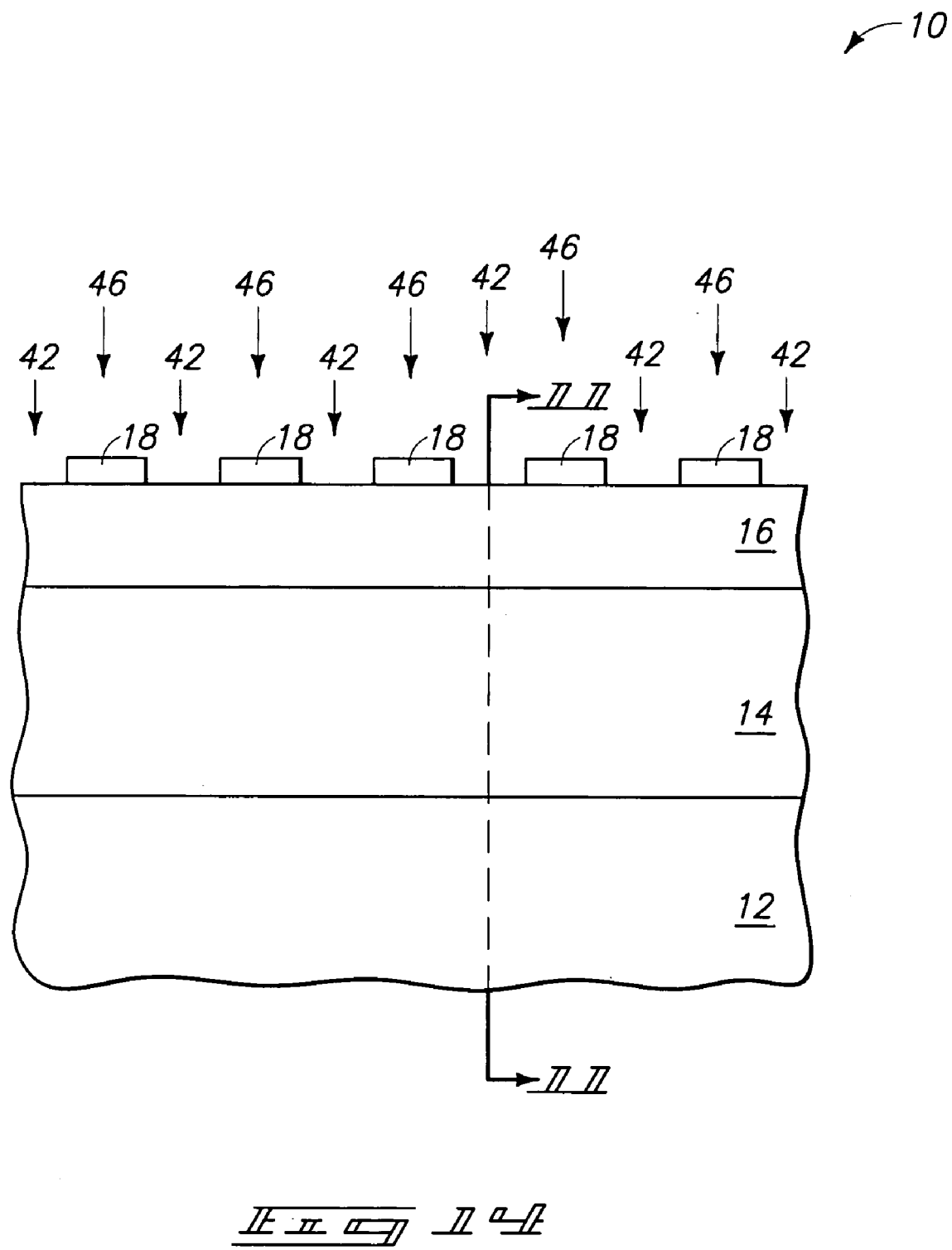

Referring next to FIGS. 11–14, a pattern from patterned photoresist 30 (FIGS. 9 and 10) is substantially reproduced within layer 18 by using the patterned photoresist 30 during an etch of layer 18. Such etch forms upwardly-projecting features 40 within layer 18 as shown in FIG. 11, and forms trenches (or downwardly-projecting features) 42 between the upwardly-projecting features 40. The etch is conducted to a sufficient depth that trenches 42 extend entirely through layer 18 to expose an upper surface of material 16. However, trenches 42 are formed in locations where layer 18 had already been thinned by the first etch described with reference to FIGS. 5 and 6 (i.e., are formed in locations corresponding to trenches 28 of FIGS. 5 and 6). In other words, regions 42 correspond to the locations of the wells 36 described previously with reference to FIG. 10. The etch into layer 18 of FIGS. 11–14 is not sufficient to etch entirely through the starting thickness of layer 18. This is evidenced by FIG. 14 which shows projections 46 of layer 18 corresponding to regions where the initial thickness of layer 18 was exposed to the etch which formed trenches 42, and further which showed that such etch was insufficient to entirely remove layer 18. More specifically, the projections 46 correspond to regions of layer 18 that had been protected by the first patterned photoresist 20 of FIGS. 3 and 4, and specifically corresponds to regions of upwardly projecting features 26 (FIGS. 5 and 6) which were not protected by the second patterned photoresist 30 (FIGS. 9 and 10). Accordingly, projections 46 correspond to portions of masking material 18 which had the entire initial thickness of layer 18 at the initiation of the etch of FIGS. 11–14, and show that the etch did not penetrate through the entire initial thickness of the masking layer.

Since the combined depths of the first etch described with reference to FIGS. 5 and 6 and the second etch described with reference to FIGS. 11–14 are sufficient to penetrate entirely through masking layer 18, but neither etch is sufficient by itself to penetrate entirely through the masking layer, the combined etches form the masking layer into a patterned mask comprising upward projections 40 and 46, and wells (or openings) 42 between the projections. The projections 40 and 46 define a latticework (the latticework is regions of material 18 surrounding openings extending to layer 16, and each of the boxes in FIG. 12 with a "16" in it corresponds to an opening, or well 42 extending through the latticework). The wells 42 have a substantially polygonal shape. The shown polygonal shape is substantially diamondlike, but it is to be understood that other polygonal shapes can be formed, including, for example, rectangular shapes, square shapes, polygonal shapes having three sides, or polygonal shapes having five or more sides.

Although only two photomasking steps are described in the processing of FIGS. 1–14 for forming the latticework of projections 40 and 46, it is to be understood that other methodology can be utilized in which more than two separate photomasking steps are utilized to form a desired latticework.

It is noted that the pattern imparted into layer 18 through the two photomasking steps described with regard to FIGS. 1–14 is different than either of the patterns utilized in the two photomasking steps, but instead corresponds to a third pattern comprising a combination of the two patterns utilized in the photomasking steps.

In particular aspects, openings 42 can be considered to be regions where a first series of trenches defined utilizing a first photolithographic process (the first series of trenches corresponding to the trenches 28 of FIGS. 5 and 6) overlap a second series of trenches formed utilizing a second photolithographic process (the second series of trenches being defined by the photolithography of FIGS. 9 and 10 and corresponding to the trenches formed by the etch of FIGS. 11–14), and the latticework can be considered to be regions where the first series of trenches do not overlap with the second series of trenches. Accordingly, the openings 42 can be referred to as locations of overlap regions between the two crossing series of trenches, and the latticework comprising projections 40 and 46 can be defined as regions where the trenches of the two series do not overlap, (or in other words as non-overlap regions).

The second series of trenches formed utilizing the photomask processing of FIGS. 9–14 are a series of substantially straight lines which are substantially orthogonal to the first series of trenches defined by the photomasking of FIGS. 3–6. It is to be understood that other methodology can be utilized wherein the second series of trenches are not substantially orthogonal to the first series of trenches, and wherein the second series of trenches are not substantially straight lines. Further, it is to be understood that either or both of the first and second series of trenches can be wavy lines, or straight lines, in various aspects.

The openings 42 defined by the patterned mask formed from masking layer 18 can be utilized to pattern dopant formed into underlying materials and/or to pattern underlying materials during subsequent etching. An advantage of the process described herein is that openings 42 can be formed into shapes which are not attainable with a single photomask used alone, and further that the openings 42 can be formed to dimensions smaller than that which would be achievable with a single photomask used alone. Accordingly, methodology described herein could be used to extend photolithographic processing beyond the limitations conventionally achievable. In particular aspects, the processes described herein can be used to extend a particular generation of photolithographic processing to a new generation. For instance, the processes could be utilized with 248 nanometer wavelength tools to extend the tools to achieve dimensions conventionally associated with 193 nanometer wavelength processing or smaller; could be utilized with 193 nanometer wavelength tools to extend the tools to achieve dimensions conventionally associated with 157 nanometer wavelength processing or smaller; etc. Processing described herein can have application to any scale of integration, and in particular aspects can have application to $4F^2$ technologies, $6F^2$ technologies, etc.

In particular applications of methodology of the present invention, openings 42 are of an appropriate size and distribution to form an array of capacitor container openings in an underlying material.

Figure 15:
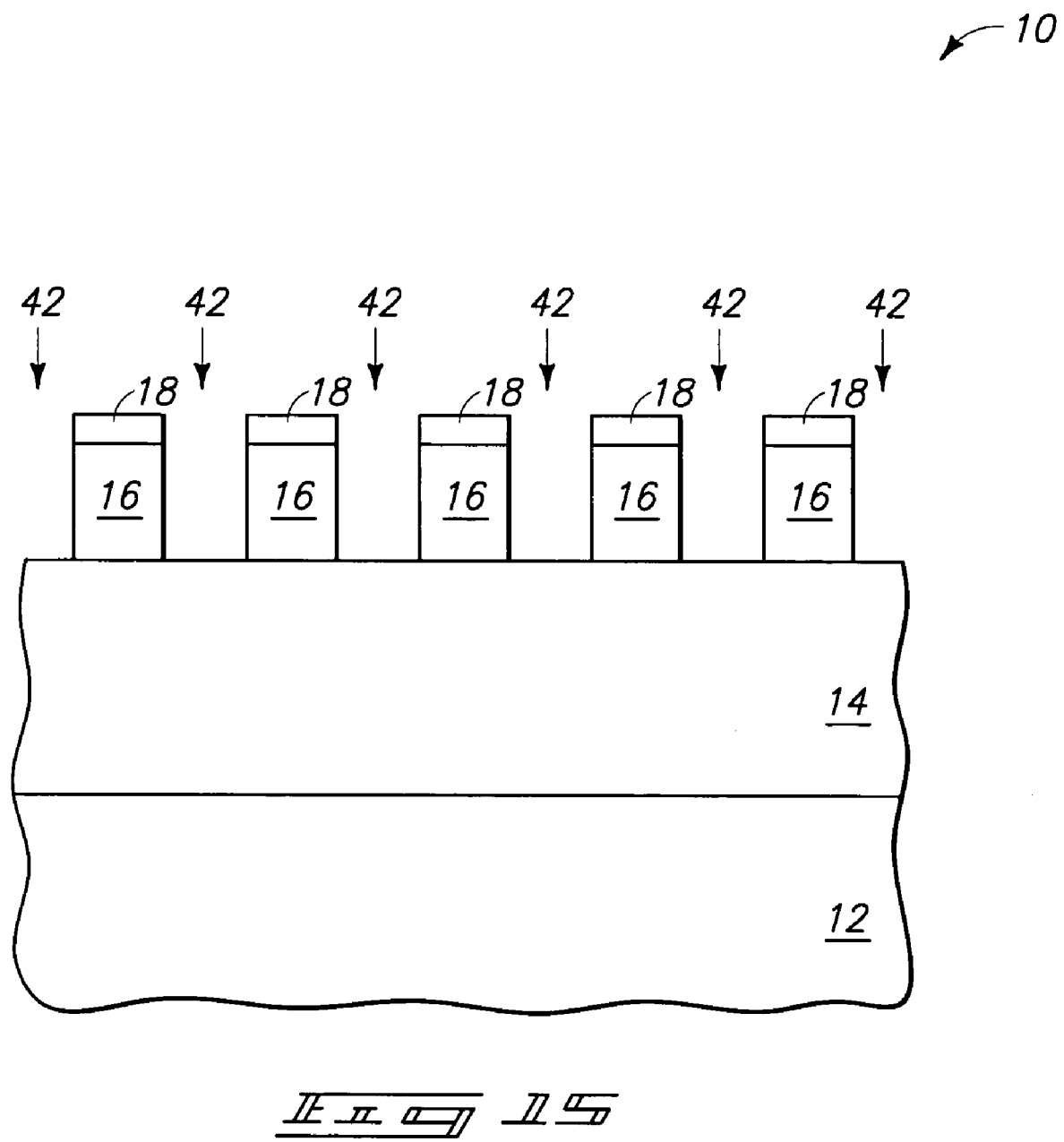
FIGS. 15 and 16 are a cross-sectional view and top view, respectively, of a semiconductor wafer fragment shown at a processing stage subsequent to that of FIGS. 11, 12, 13 and 14. The cross-section of FIG. 15 is shown along the line 15—15 of FIG. 16.
Figure 16:
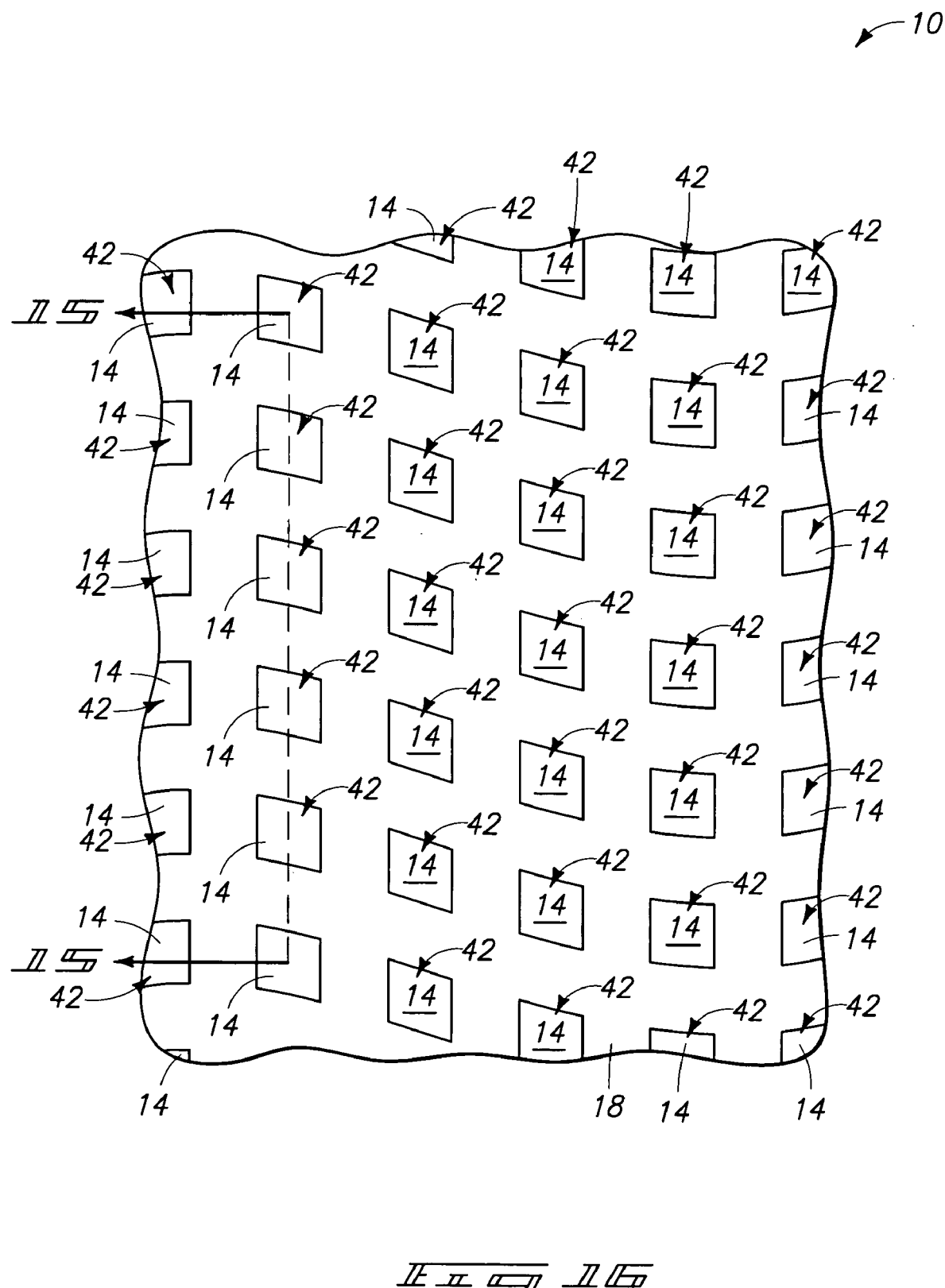

FIGS. 15 and 16 show construction 10 after an etch has been utilized to extend openings 42 into underlying material 16. Such etch can be considered to transfer a substantial reproduction of a capacitor container pattern defined by the latticework of patterned material 18 into the underlying material 16.

In particular aspects, layer 16 is a material which is substantially selectively etchable relative to material 18, and further material 16 is a material to which underlying material 14 can be substantially selectively etched. In such aspects, material 16 can be referred to as an intervening material in that the material 16 is between the material 14 which ultimately is to be etched and the masking layer 18 which defines a pattern which is to be substantially imparted into the material 14. A reason for using intervening material 16 is that there can be applications in which it is difficult to selectively etch material 14 relative to masking layer 18. For instance, if material 14 comprises a doped silicon oxide and material 18 comprises a silicon oxynitride, it is difficult to substantially selectively etch the doped silicon oxide relative to the silicon oxynitride. In such applications, the material 16 can be utilized as a hard mask which is patterned with a mask defined by material 18, and which is subsequently utilized for the patterning of underlying material 14.

The pattern defined by the latticework of material 18 can be considered to be "substantially reproduced" within underlying material 16 by an etch conducted while the latticework of material 18 is over material 16, or, in other words, a "substantial facsimile" of the two-dimensional pattern of the latticework can be considered to be transferred to material 16. The terms "substantially reproduced" and "substantial facsimile" encompasses situations in which a pattern from latticework 18 is exactly reproduced within material 16, as well as situations in which the patterned reproduced within material 16 is less than an exact copy. The pattern formed within material 16 can be less than an exact copy of the pattern in latticework 18 for a number of reasons associated with processing limitations, including, for example: (1) that an etch utilized to transfer the pattern into material 16 may be less than a purely anisotropic etch, which can lead to undercutting of material 18; (2) that an etch utilized to transfer the pattern into material 16 may have decreasing etching efficiency as it proceeds more deeply into material 16 which can lead to a narrower dimension within material 16 at the bottom of the openings 42 than at the top of the openings 42; and/or (3) that changes in the shape of mask 18 during the etch of material 16 due to less than 100% selectivity of the etch for the material 16 relative to the material 18 can lead to alterations of the mask shape during the transfer of the pattern into material 16.

Figure 17:
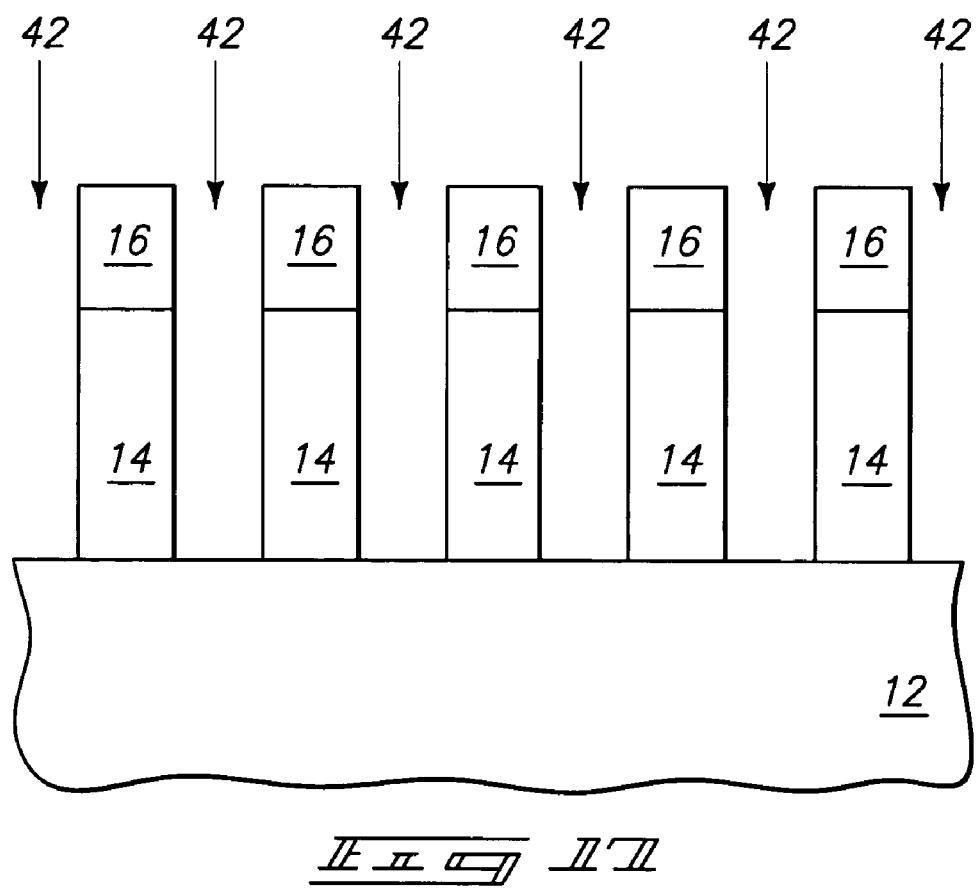

Referring to FIGS. 17 and 18, openings 42 are extended into material 14 with a suitable etch. The masking layer 18 (FIGS. 15 and 16) is shown removed, as would be typical if the etch for material 14 was substantially non-selective relative to the material 18. The etch into material 14 can, in particular aspects, be considered transferring a substantial reproduction of the capacitor container pattern initially defined by patterned mask 18 into the material 14. During the etching of material 14, patterned material 16 functions as a hard mask. The etching into material 14 can be considered to form a plurality of capacitor containers within material 14, with such capacitor containers corresponding to locations where openings 42 extend through material 14 to substrate 12.

In some aspects, the etching of layer 18 in FIGS. 1–6 can be considered to comprise first and second etching conditions (which would typically be the same as one another), the etching of layer 16 in FIGS. 15 and 16 can be considered to comprise third etching conditions, and the etching of layer 14 in FIGS. 17 and 18 can be considered to comprise fourth etching conditions which are different than the third etching conditions.

Figure 19:
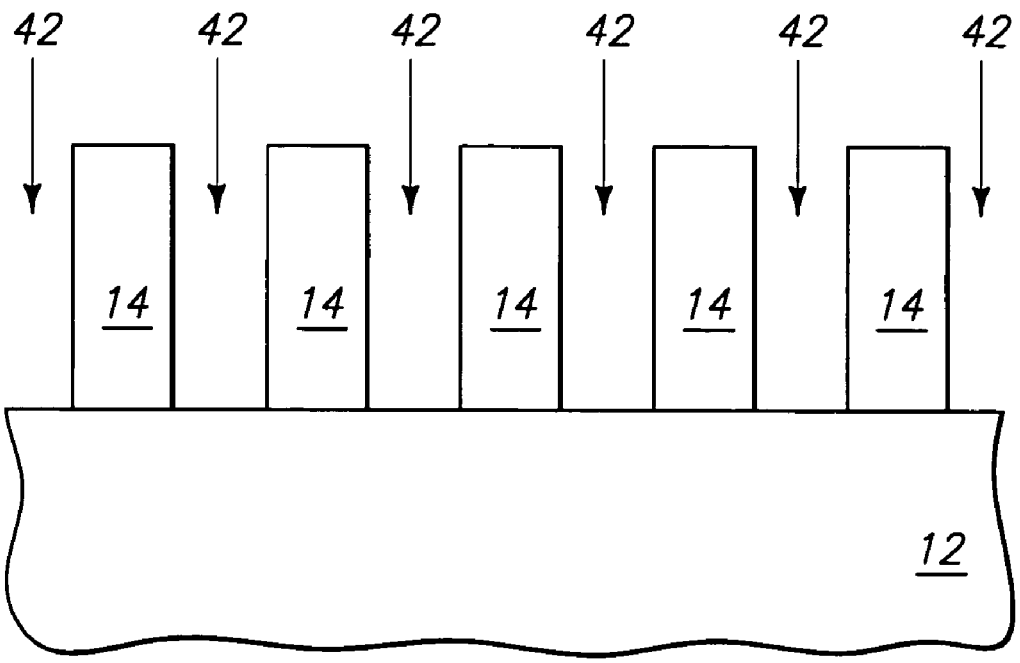
FIGS. 19 and 20 correspond to a cross-sectional view and top view, respectively, of a semiconductor wafer fragment shown at a processing stage subsequent to that of FIGS. 17 and 18. The cross-sectional view of FIG. 19 is shown along the line 19—19 of FIG. 20.
Figure 20:
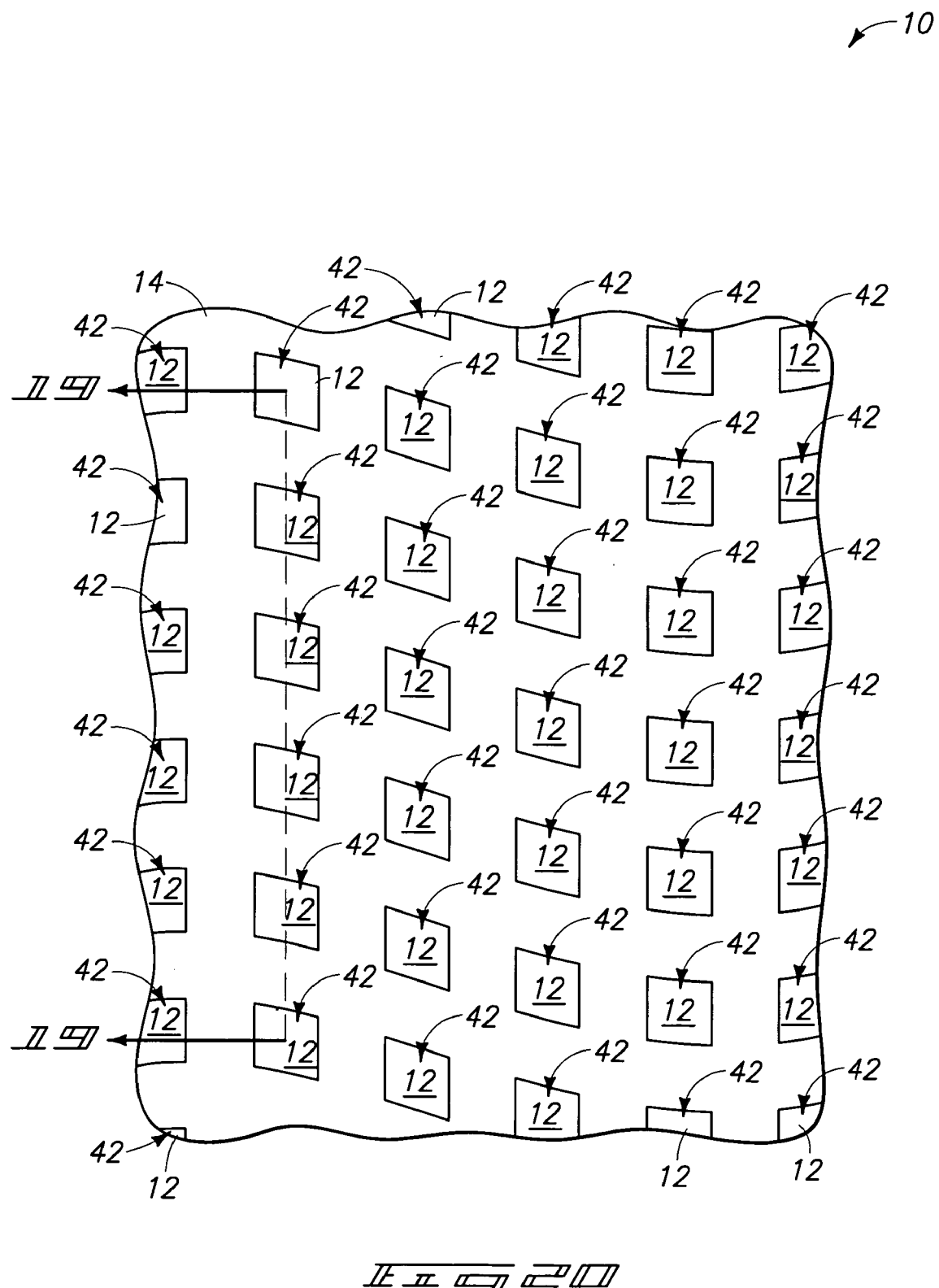

Referring to FIGS. 19 and 20, material 16 is removed from over material 14 with a suitable etch. The structure of FIGS. 19 and 20 has a capacitor-container-scaffold corresponding to remaining portions of material 14, and a plurality of capacitor container openings corresponding to the openings 42 which extend through material 14.

Referring to FIG. 21, a first capacitor electrode 50, a dielectric material 52 and a second capacitor electrode 54 are formed within capacitor container openings 42 to define a plurality of capacitors 63. First capacitor electrode 50 and second capacitor electrode 54 can comprise any suitable electrically conductive materials, including, for example, one or more of metal, metal compound, or appropriately doped semiconductive material, such as, for example, appropriately doped polycrystalline silicon. Dielectric material 52 can comprise any suitable material, including, for example, silicon dioxide, silicon nitride, aluminum oxide, and/or various high-k dielectric materials. The capacitor constructions can be electrically connected to source/drain regions of transistors 58 to incorporate the capacitors into a dynamic random access memory (DRAM) array.

Although capacitors are shown formed within all of the openings 42, it is to be understood that the invention encompasses other aspects (not shown) in which different semiconductor constructions are formed within some of the openings, such as, for example, aspects in which bitline connections are formed within some of the openings.

Figure 22:
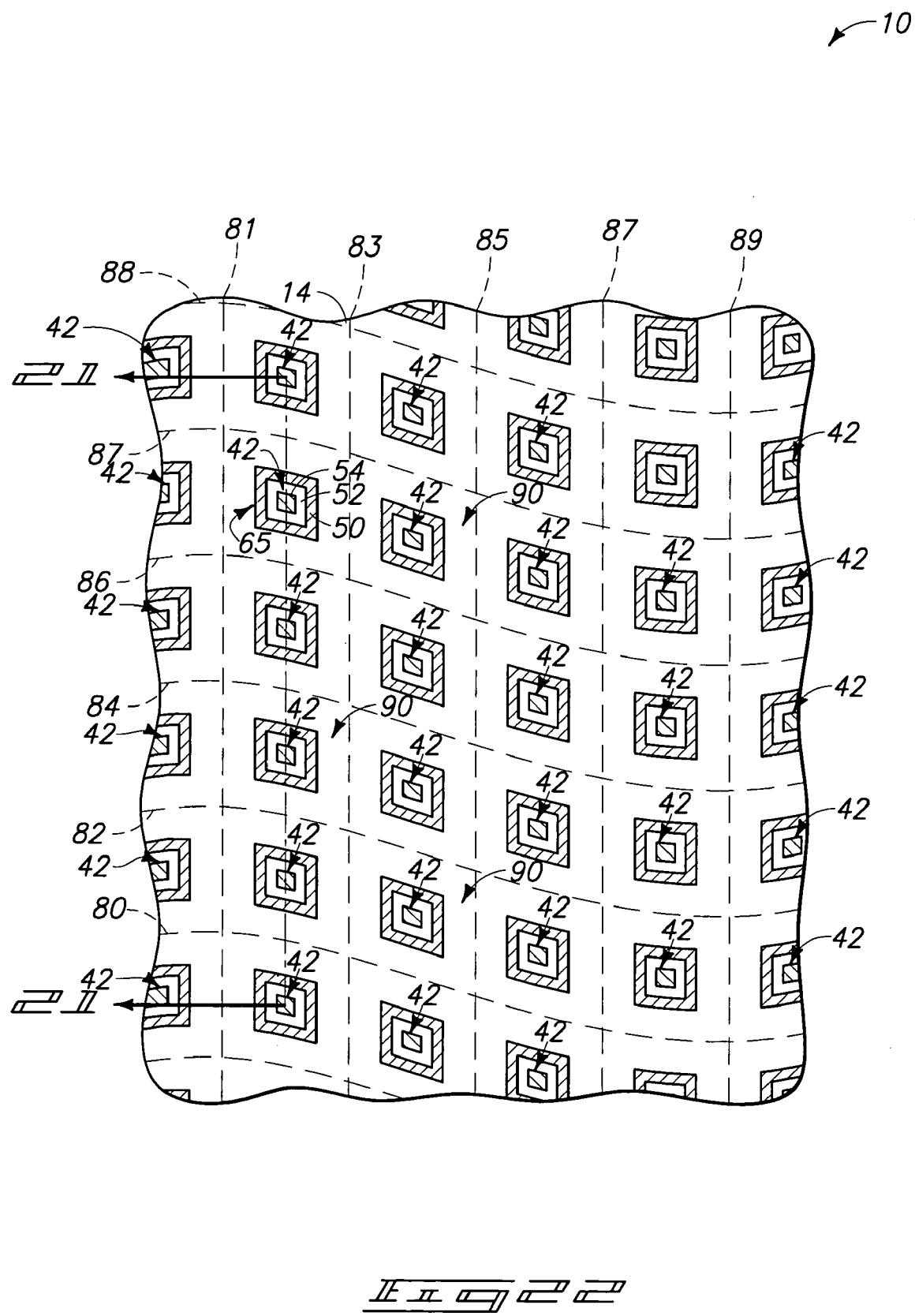
FIG. 22 is a cross-sectional view of the semiconductor wafer fragment of FIG. 21 along the line 22—22, and shows a line 21—21 to indicate the relative location of the cross-sectional view of FIG. 21.

The individual capacitors 63 formed within openings 42 of FIG. 21 have storage nodes 61 that are container-shaped. The container shapes include an open end 65 and a periphery around such open end. FIG. 22 shows a cross-sectional view along the line 22—22 of FIG. 21, and shows that the periphery around the open ends 63 is substantially polygonal. The shown polygonal shape is non-triangular, and specifically contains exactly four prominent sides. The particular polygonal shape can be considered to be substantially a diamond, or alternatively can be considered to be substantially rectangular or square. The non-triangular peripheral shape of the present invention can be advantageous relative to the triangular shapes for at least the reason that the non-triangular shapes can have wider angles at the corners than would triangular shapes, which can simplify provision of dielectric and other materials within the containers, as well as simplify formation of the containers themselves. Also, the non-triangular shapes can better fill allocated regions across a semiconductor substrate than can triangular shapes in most arrays. Specifically, the allocated regions would typically be rectangular, or square, and accordingly non-triangular shapes can better maximize the utilization of the allocated region than can triangular shapes.

Dashed lines 80–89 are utilized in FIG. 22 to demarcate allocated regions for capacitor constructions. The allocated regions form an array across the construction 10 of FIG. 22, with individual allocated regions being indicated by the label 90 (only some of the allocated regions are labeled). The allocated regions have approximately the same shape as the polygonal opening 65 of the storage node 61. Accordingly, storage node 61 can be formed to substantially maximize a peripheral area which can be comprised by the storage node within an individual allocated region. Such can maximize, or at least substantially maximize, the peripheral capacitive area of a capacitor formed within an individual allocated region, which can in turn maximize, or at least substantially maximize, the capacitance obtained within a given allocated region for capacitor formation.

Referring again to FIG. 21, the container openings 42 extending within insulative material 14 are shown comprising a vertical dimension 71 corresponding to a depth of the openings, and a horizontal dimension 73 corresponding to a width of the openings. The openings comprise a substantially polygonal cross-section along the horizontal dimension (as illustrated in FIG. 22). The storage nodes 61 are formed within such openings, and comprise the shape defined by the openings. Accordingly, the storage nodes also comprise a substantially polygonal cross-section along the horizontal dimension of the storage nodes.

The storage nodes 61 can be considered first capacitor electrodes extending within openings 42. In the aspect of the invention shown in FIG. 21, the dielectric material 52 and the second capacitor electrode 54 both also extend within openings 42, and specifically both extend within capacitor containers defined by container-shaped storage nodes 61. Capacitor electrode 54 can be considered to be capacitively spaced from storage node 61 by at least dielectric material 52. In the shown aspect of the invention, capacitor electrode 54 is spaced from capacitor electrode 61 by only a single dielectric material 52, but it is to be understood that multiple dielectric materials can be provided between storage node 61 and capacitor electrode 54. Also, it is to be understood that storage node 61 can comprise multiple layers, and further that capacitor electrode 54 can comprise multiple layers.

It is noted that the structures shown in FIG. 21 are in some aspects idealized relative to structures actually formed. For instance, the openings 42 would typically not have an identical shape from the top of the openings to the bottom of the openings, but instead would narrow and lose definition of particular features at increasing depths of the openings. The change in characteristics of the openings at increasing depths would lead to changes in the storage nodes 61 at increasing depths. Still, the capacitor constructions of the present invention would have a horizontal cross-section having a polygonal shape, with such horizontal cross-section being at least at the uppermost region of the container opening defined by the storage nodes.

In various aspects of the invention, the transistor devices 58 diagrammatically illustrated in FIG. 21 can be considered to be supported by semiconductor substrate 12. Each of the transistor devices would comprise a pair of source/drain regions which are gatedly connected to one another through the transistor device, as is known to persons of ordinary skill in the art. A storage node 61 can be electrically connected to one of the source/drain regions associated with the transistor device (actually ohmically connected), and the other of the source/drain regions can be connected to a bitline, so that the storage node is gatedly connected to the bitline through the transistor device. The transistor device can be formed as part of a wordline, and accordingly the plurality of transistor devices 58 represented in FIG. 21 can correspond to a series of transistor devices formed within an array of wordlines and bitlines. The array of wordlines and bitlines can be utilized for reading from and writing to individual memory storage devices defined by the capacitor constructions extending within openings 42. The array of memory devices, bitlines and wordlines can together be considered to be a dynamic random access memory (DRAM) array.

Figure 23:
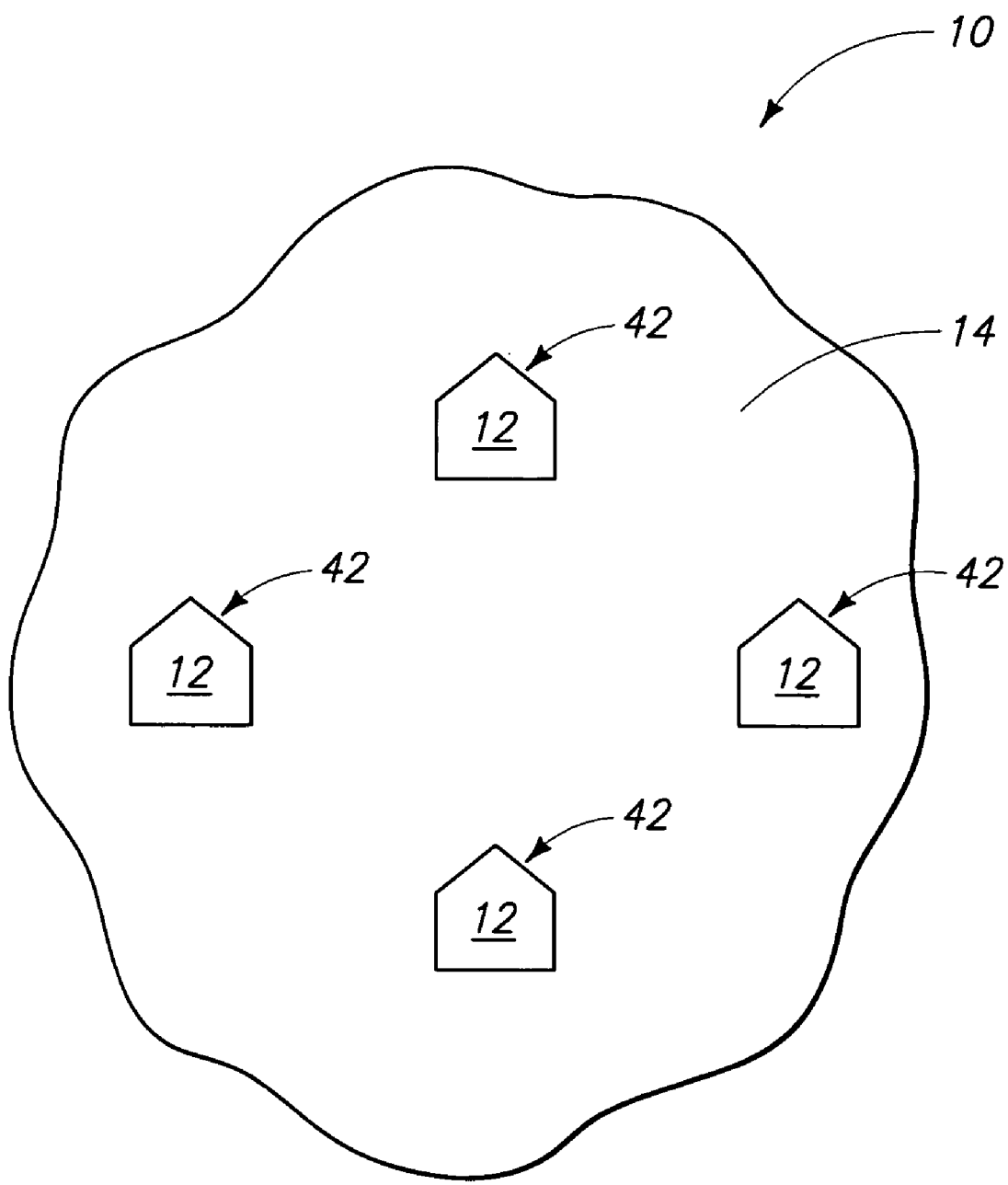
FIG. 23 is a top view of a semiconductor wafer fragment at a processing stage analogous to that of FIG. 20, but showing an alternative embodiment relative to that of FIG. 20.
Figure 24:
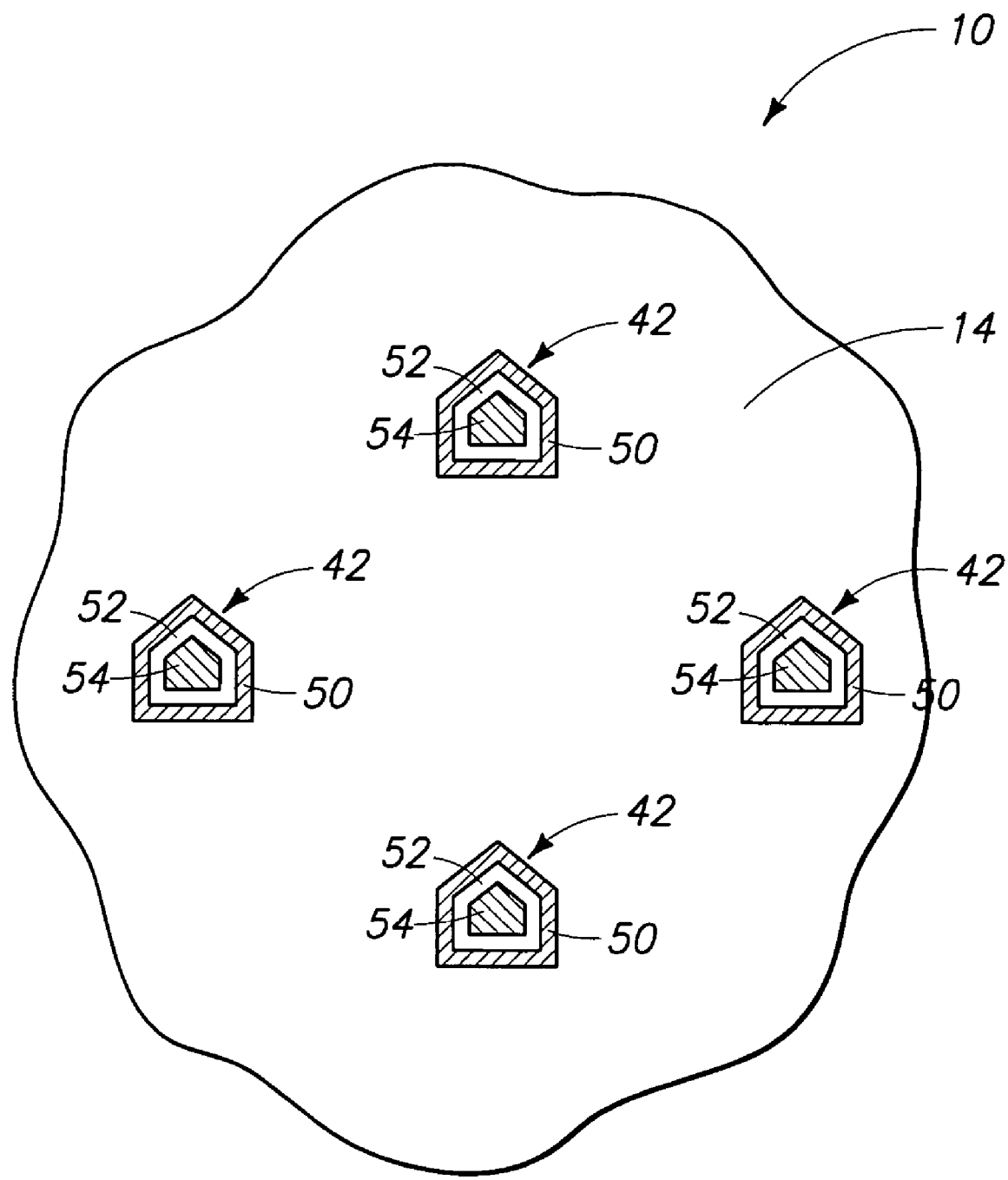
FIG. 24 is a top view of the semiconductor wafer fragment of FIG. 23 shown at a processing stage subsequent to that of FIG. 23. The processing stage of FIG. 24 can be considered to be analogous to that of FIG. 22, but an alternative embodiment relative to that of FIG. 22.

The capacitor structures of FIGS. 21 and 22 are but one example of capacitor structures having polygonal-shaped storage nodes. It is to be understood that the polygonal shapes can comprise numerous other shapes, including, for example, pentagonal shapes, hexagonal shapes, etc. FIGS. 23 and 24 show a top view of construction 10 illustrating an alternative aspect of the invention relative to that described above. FIG. 23 shows a construction 10 at a processing stage analogous to that of FIG. 20, but showing the diamond or rectangular shaped openings 42 of FIG. 20 replaced with substantially pentagonal-shaped openings. Accordingly, the openings 42 of FIG. 23 have a peripheral shape comprising more than four primary sides, and in the shown embodiment such peripheral shapes specifically comprise five primary sides.

FIG. 24 shows construction 10 at a processing stage subsequent to that of FIG. 23, and specifically shows the construction at a processing stage analogous of that of FIG. 22. Accordingly, pentagonal-shaped container storage nodes are formed within pentagonal-shaped openings 42 with material 50, and subsequently dielectric material 52 and second capacitor electrode material 54 are formed within the openings to form capacitor structures analogous to the structures described previously with reference to FIGS. 21 and 22.

Figure 25:
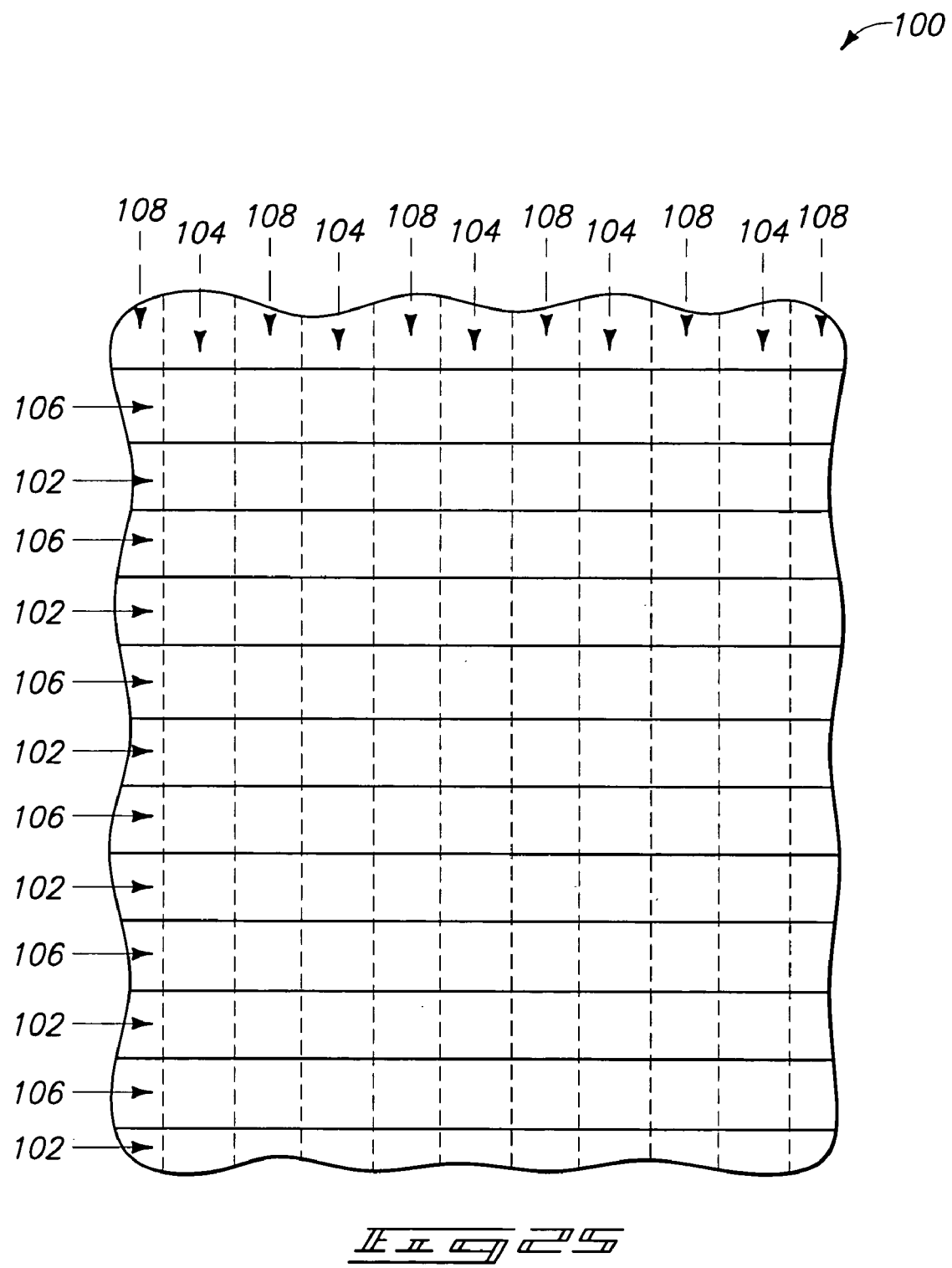
FIG. 25 is a top view of a semiconductor wafer fragment processed in accordance with a method alternative to that described above with reference to FIGS. 1–21, and which can also be utilized in aspects of the present invention.

The processing described above with reference to FIGS. 1–14 illustrates a method in which a pair of photomasks was utilized to form a pattern comprising wavy line trenches and straight line trenches. As discussed previously, the methodology can encompass other aspects, such as, for example, aspects in which all of the trenches are substantially straight lines. FIG. 25 illustrates such aspect. Specifically, FIG. 25 shows a top view of a construction 100 with a first series of locations 102 for a first series of upwardly-extending projections formed by a first photolithographic process, and with an orthogonal series of locations 104 (in dashed line view) for a second series of upwardly-extending projections formed by a second photolithographic process. Substantially linear trenches 106 will be defined between the upwardly-extending projections formed in locations 102, and another set of trenches 108 will be defined between the upwardly-extending projections in locations 104, with the trenches 108 extending orthogonally relative to the trenches 106. In accordance with processing analogous to that described previously with reference to FIGS. 1–14, the projections 102 will be formed with sequentially separate photomasking from the projections 104. FIG. 25 illustrates an alternative aspect of the invention relative to that described previously with reference to FIGS. 1–14, and in a sense can be considered to demonstrate an aspect of the invention in which the projections 22 of FIGS. 3 and 4 are straight lines rather than wavy lines.

Figure 26:
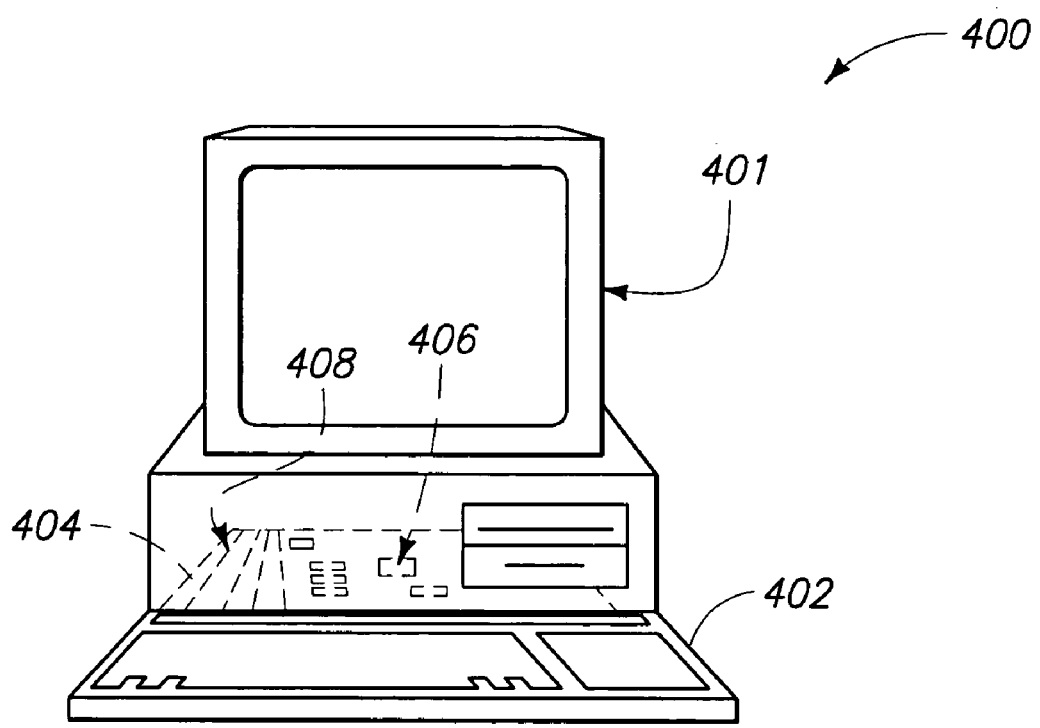
FIG. 26 is a diagrammatic view of a computer illustrating an exemplary application of the present invention.
Figure 27:
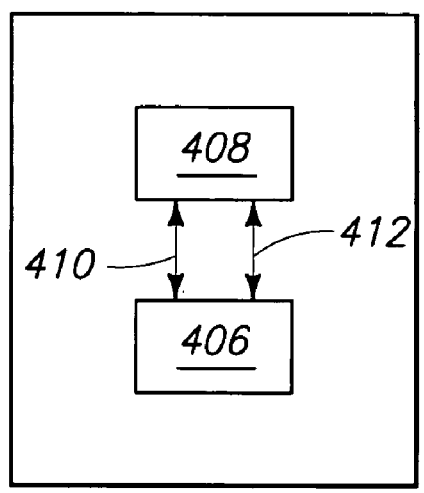
FIG. 27 is a block diagram showing particular features of the motherboard of the FIG. 26 computer.

FIG. 26 illustrates generally, by way of example, but not by way of limitation, an embodiment of a computer system 400 according to an aspect of the present invention. Computer system 400 includes a monitor 401 or other communication output device, a keyboard 402 or other communication input device, and a motherboard 404. Motherboard 404 can carry a microprocessor 406 or other data processing unit, and at least one memory device 408. Memory device 408 can comprise various aspects of the invention described above. Memory device 408 can comprise an array of memory cells, and such array can be coupled with addressing circuitry for accessing individual memory cells in the array. Further, the memory cell array can be coupled to a read circuit for reading data from the memory cells. The addressing and read circuitry can be utilized for conveying information between memory device 408 and processor 406. Such is illustrated in the block diagram of the motherboard 404 shown in FIG. 27. In such block diagram, the addressing circuitry is illustrated as 410 and the read circuitry is illustrated as 412. Various components of computer system 400, including processor 406, can comprise one or more of the memory constructions described previously in this disclosure.

Processor device 406 can correspond to a processor module, and associated memory utilized with the module can comprise teachings of the present invention.

Memory device 408 can correspond to a memory module. For example, single in-line memory modules (SIMMs) and dual in-line memory modules (DIMMs) may be used in the implementation which utilize the teachings of the present invention. The memory device can be incorporated into any of a variety of designs which provide different methods of reading from and writing to memory cells of the device. One such method is the page mode operation. Page mode operations in a DRAM are defined by the method of accessing a row of a memory cell arrays and randomly accessing different columns of the array. Data stored at the row and column intersection can be read and output while that column is accessed.

An alternate type of device is the extended data output (EDO) memory which allows data stored at a memory array address to be available as output after the addressed column has been closed. This memory can increase some communication speeds by allowing shorter access signals without reducing the time in which memory output data is available on a memory bus. Other alternative types of devices include SDRAM, DDR SDRAM, SLDRAM, VRAM and Direct RDRAM, as well as others such as SRAM or Flash memories.

Memory device 408 can comprise memory formed in accordance with one or more aspects of the present invention.

Figure 28:
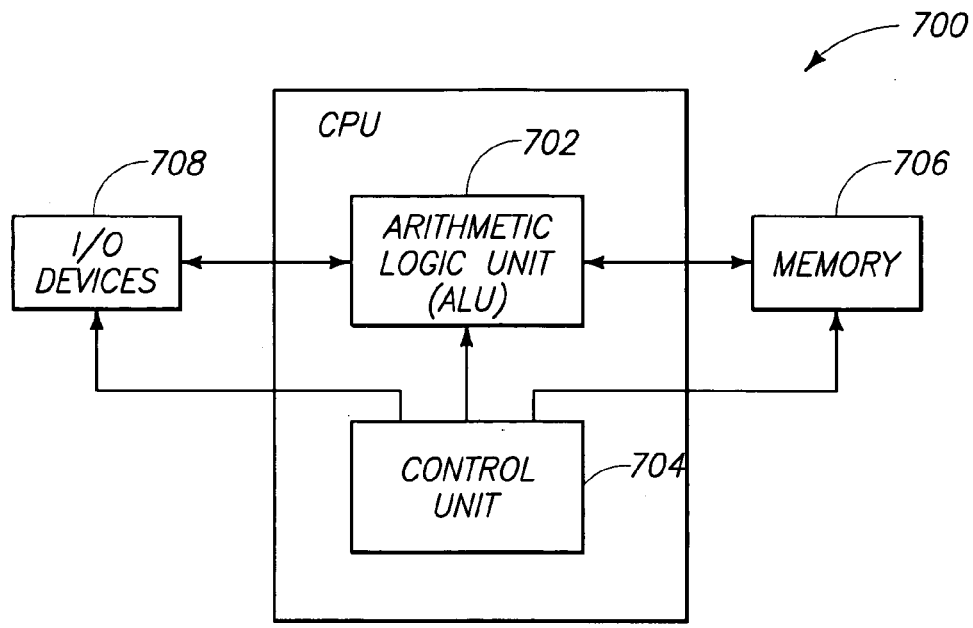
FIG. 28 is a high-level block diagram of an electronic system according to an exemplary aspect of the present invention.

FIG. 28 illustrates a simplified block diagram of a high-level organization of various embodiments of an exemplary electronic system 700 of the present invention. System 700 can correspond to, for example, a computer system, a process control system, or any other system that employs a processor and associated memory. Electronic system 700 has functional elements, including a processor or arithmetic/logic unit (ALU) 702, a control unit 704, a memory device unit 706 and an input/output (I/O) device 708. Generally, electronic system 700 will have a native set of instructions that specify operations to be performed on data by the processor 702 and other interactions between the processor 702, the memory device unit 706 and the I/O devices 708. The control unit 704 coordinates all operations of the processor 702, the memory device 706 and the I/O devices 708 by continuously cycling through a set of operations that cause instructions to be fetched from the memory device 706 and executed. In various embodiments, the memory device 706 includes, but is not limited to, random access memory (RAM) devices, read-only memory (ROM) devices, and peripheral devices such as a floppy disk drive and a compact disk CD-ROM drive. One of ordinary skill in the art will understand, upon reading and comprehending this disclosure, that any of the illustrated electrical components are capable of being fabricated to include memory constructions in accordance with various aspects of the present invention.

Figure 29:
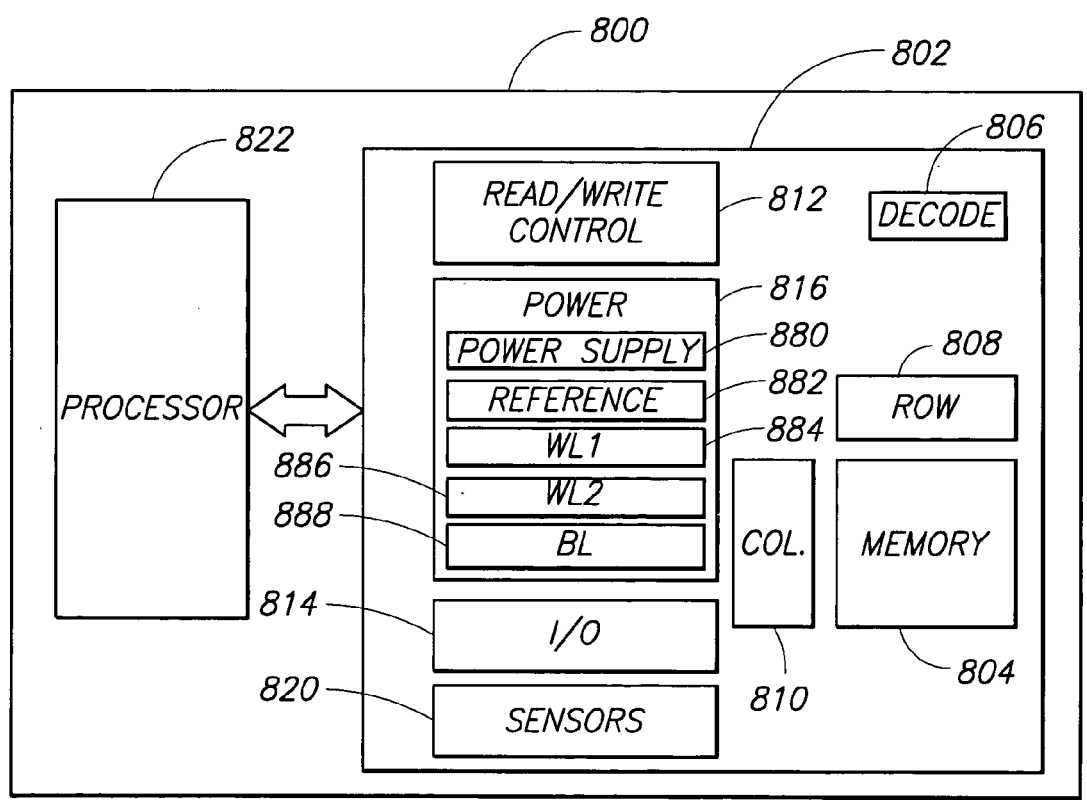
FIG. 29 is a simplified block diagram of an exemplary memory device according to an aspect of the present invention.

FIG. 29 is a simplified block diagram of a high-level organization of various embodiments of an exemplary electronic system 800. The system 800 includes a memory device 802 that has an array of memory cells 804, address decoder 806, row access circuitry 808, column access circuitry 810, read/write control circuitry 812 for controlling operations, and input/output circuitry 814. The memory device 802 further includes power circuitry 816, and sensors 820, such as current sensors for determining whether a memory cell is in a low-threshold conducting state or in a high-threshold non-conducting state. The illustrated power circuitry 816 includes power supply circuitry 880, circuitry 882 for providing a reference voltage, circuitry 884 for providing the first wordline with pulses, circuitry 886 for providing the second wordline with pulses, and circuitry 888 for providing the bitline with pulses. The system 800 also includes a processor 822, or memory controller for memory accessing.

The memory device 802 receives control signals 824 from the processor 822 over wiring or metallization lines. The memory device 802 is used to store data which is accessed via I/O lines. It will be appreciated by those skilled in the art that additional circuitry and control signals can be provided, and that the memory device 802 has been simplified to help focus on the invention. At least one of the processor 822 or memory device 802 can include a memory construction of the type described previously in this disclosure.

The various illustrated systems of this disclosure are intended to provide a general understanding of various applications for the circuitry and structures of the present invention, and are not intended to serve as a complete description of all the elements and features of an electronic system using memory cells in accordance with aspects of the present invention. One of the ordinary skill in the art will understand that the various electronic systems can be fabricated in single-package processing units, or even on a single semiconductor chip, in order to reduce the communication time between the processor and the memory device(s).

Applications for memory cells can include electronic systems for use in memory modules, device drivers, power modules, communication modems, processor modules, and application-specific modules, and may include multilayer, multichip modules. Such circuitry can further be a subcomponent of a variety of electronic systems, such as a clock, a television, a cell phone, a personal computer, an automobile, an industrial control system, an aircraft, and others.

It is noted that relative elevational relationships are utilized to describe the locations of various features to one another (e.g., upward, downward, etc are utilized) within this disclosure. It is to be understood that such terms are used to express relative relations between the components only, and not to indicate a relationship of the components relative to an external frame of reference. Thus, for example, a feature described herein as projecting upwardly relative to another feature may in fact appear to extend downwardly to a viewer in an external frame of reference relative to the feature.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of forming an opening through a masking layer, comprising utilization of at least two sequential photomasking steps which in combination form the opening through the masking layer but which are not sufficient alone to form the opening through the masking layer; the photomasking steps each comprising utilization of an etch to pattern the masking layer while a patterned photoresist mask is over the masking layer and each utilizing a separate photoresist mask from one another; and wherein the opening has a polygonal shape having more than four sides.

2. A method of forming an opening through a masking layer, comprising utilization of at least two sequential photomasking steps which in combination form the opening through the masking layer but which are not sufficient alone to form the opening through the masking layer; the photomasking steps each comprising utilization of an etch to pattern the masking layer while a patterned photoresist mask is over the masking layer and each utilizing a separate photoresist mask from one another; and wherein the opening has a substantially diamond shape.

3. A method of forming an opening through a masking layer, comprising utilization of at least two sequential photomasking steps which in combination form the opening through the masking layer but which are not sufficient alone to form the opening through the masking layer; the photomasking steps each comprising utilization of an etch to pattern the masking layer while a patterned photoresist mask is over the masking layer and each utilizing a separate photoresist mask from one another; and wherein:

the masking layer consists essentially of silicon, oxygen and nitrogen;

the masking layer is over a layer consisting essentially of amorphous carbon;

the layer consisting essentially of amorphous carbon is over an electrically insulative material; and the opening in the masking layer is utilized to form a capacitor container within the electrically insulative material.

4. A method of forming an opening, comprising the following steps in the following order:

providing a substrate having a masking layer, the masking layer having an initial thickness and being entirely of a single uniform composition;

forming a first patterned photoresist over the masking layer;

using the first patterned photoresist during a first etch into the masking layer, the first etch extending to another depth in the masking layer that is less than the initial thickness of the masking layer;

forming a second patterned photoresist over the masking layer;

using the second patterned photoresist during a second etch into the masking layer, the second etch extending to another depth in the masking layer that is less than the initial thickness of the masking layer; the combined depths to which the first and second etches extend into the masking layer being greater than the initial thickness of masking layer; the first and second etches forming the masking layer into a patterned mask having a third pattern different from the patterns of the first and second patterned photoresists; and using the patterned mask to pattern a region of the substrate beneath the patterned mask.

5. The method of claim 4 wherein the masking layer comprises silicon and nitrogen.

6. The method of claim 4 wherein the masking layer comprises silicon, oxygen and nitrogen.

7. The method of claim 4 wherein the masking layer consists essentially of silicon, oxygen and nitrogen.

8. A method of forming an opening, comprising the following steps in the following order:
provarianing a substrate having a masking layer, the masking layer having an initial thickness;
forming a first patterned photoresist over the masking layer;
using the first patterned photoresist during a first etch into the masking layer, the first etch extending to another depth in the masking layer that is less than the initial thickness of the masking layer;
forming a second patterned photoresist over the masking layer;
using the second patterned photoresist during a second etch into the masking layer, the second etch extending to a depth in the masking layer that is less than the initial thickness of the masking layer; the combined depths to which the first and second etches extend into the masking layer being greater than the initial thickness of masking layer; the first and second etches forming the masking layer into a patterned mask having a third pattern different from the patterns of the first and second patterned photoresists;
using the patterned mask to pattern a region of the substrate beneath the patterned mask; and
wherein the substrate comprises at least two materials, a second material of the at least two materials being between a first material of the at least two materials and the masking layer; wherein the second material is patterned with a third etch while using the patterned mask formed from the masking layer; and wherein the first material is patterned while using the patterned second material as a mask and with a fourth etch different from the third etch.

9. The method of claim 8 wherein the substrate comprises a semiconductor base; and wherein the at least two materials are over the semiconductor base.

10. The method of claim 8 wherein the masking layer comprises silicon and nitrogen, and wherein the second material consists essentially of amorphous carbon.

11. The method of claim 8 wherein the masking layer comprises silicon and nitrogen, wherein the second material consists essentially of amorphous carbon, and wherein the first material consists essentially of doped silicon oxide.

12. The method of claim 8 wherein the first material comprises a doped silicon oxide and the second material comprises amorphous carbon.

13. The method of claim 8 wherein the first material comprises a doped silicon oxide, the second material comprises amorphous carbon and the masking layer comprises silicon oxynitride.

14. The method of claim 8 wherein the first material consists essentially of a doped silicon oxide, the second material consists essentially of amorphous carbon and the masking layer consists essentially of silicon oxynitride.

15. A method of forming an opening, comprising the following steps in the following order:
providing a substrate having a masking layer, the masking layer having an initial thickness;
forming a first patterned photoresist over the masking layer;
using the first patterned photoresist during a first etch into the masking layer, the first etch extending to another depth in the masking layer that is less than the initial thickness of the masking layer;
forming a second patterned photoresist over the masking layer;
using the second patterned photoresist during a second etch into the masking layer, the second etch extending to a depth in the masking layer that is less than the initial thickness of the masking layer; the combined depths to which the first and second etches extend into the masking layer being greater than the initial thickness of masking layer; the first and second etches forming the masking layer into a patterned mask having a third pattern different from the patterns of the first and second patterned photoresists;
using the patterned mask to pattern a region of the substrate beneath the patterned mask; and
wherein the first pattern comprises substantially linear downwardly-projecting first features, wherein the second pattern comprises substantially linear downwardly-projecting second features, and wherein locations of the downwardly-projecting second features are at right angles to locations of the downwardly-projecting first features.

16. A method of forming container capacitors, comprising:
providing a semiconductor substrate;
forming a container-scaffold-material over the semiconductor substrate;
forming a masking layer over the container-scaffold-material;
photolithographically forming a first pattern over the masking layer, the first pattern comprising a first series of trenches;
after forming the first pattern, photolithographically forming a second pattern over the masking layer, the second pattern comprising a second series of trenches; at least some trenches of the second series crossing locations of at least some of the trenches of the first series, regions where trenches of the second series overlap locations of trenches of the first series being defined as overlap regions and regions where trenches of the second series do not overlap locations of trenches of the first series being defined as non-overlap regions;
forming the masking layer into a patterned mask by extending the overlap regions entirely through the masking layer while not extending the non-overlap regions entirely through the masking layer;
using the patterned mask to form capacitor containers within the container-scaffold-material; and
forming a first capacitor electrode, dielectric material and second capacitor electrode extending within the capacitor containers to form capacitor structures within the capacitor containers.

17. The method of claim 16 wherein the masking layer comprises silicon and nitrogen.

18. The method of claim 16 wherein the masking layer consists essentially of silicon, nitrogen and oxygen.

19. The method of claim 16 wherein the container-scaffold material comprises silicon and oxygen.

20. The method of claim 16 wherein the container-scaffold material consists essentially of a doped silicon oxide.

21. The method of claim 20 wherein the container-scaffold material consists essentially of borophosphosilicate glass.

22. The method of claim 16 further comprising an intervening material between the container-scaffold-material and the masking layer, and wherein the using the masking layer to form capacitor structures within the container-scaffold-material comprises:
  using the patterned mask during an etch through the intervening material which patterns the intervening material; and
  using the patterned intervening material during an etch of the container-scaffold-material.

23. The method of claim 22 wherein the intervening material is substantially selectively etchable to both the masking layer and the container-scaffold-material.

24. The method of claim 22 wherein the container-scaffold-material comprises a doped silicon oxide, wherein the intervening material comprises amorphous carbon, and wherein the masking layer comprises silicon oxynitride.

25. The method of claim 16 wherein the second series of trenches are substantially orthogonal to locations of the first series of trenches.

26. The method of claim 16 wherein the overlap regions are substantially diamond in shape.

27. The method of claim 16 wherein the overlap regions are substantially rectangular in shape.

28. The method of claim 16 wherein the first series of trenches are wavy lines.

29. The method of claim 16 wherein the first series of trenches are wavy lines, and wherein the second series of trenches are substantially straight lines that are substantially orthogonal to locations of the first series of trenches.

* * * * *

UNITED STATES PATENT AND TRADEMARK OFFICE
CERTIFICATE OF CORRECTION

| | | |
|---|---|---|
| PATENT NO. | : 7,153,778 B2 | |
| APPLICATION NO. | : 10/783843 | |
| DATED | : December 26, 2006 | |
| INVENTOR(S) | : Busch et al. | |

It is certified that error appears in the above-identified patent and that said Letters Patent is hereby corrected as shown below:

Col. 1, line 36,
Delete "problem"
After "such" and
Insert --problems--.

Col. 1, line 57,
Insert --be--
Before "achieved".

Col. 7, line 54,
Insert --is--
After "which".

Col. 8, line 19,
Delete "36."
After "features" and
Insert --32.--.

Col. 16 line 51, claim 4,
Delete "another"
After "to" and
Insert --a--.

Col. 16 line 58, claim 4,
Delete "another"
After "to" and
Insert --a--.

Col. 18 line 61, claim 19,
Delete "scaffold material"
Before "consists" and
Insert --scaffold-material--.

Col. 18 line 63, claim 20,
Delete "scaffold material"
Before "consists" and
Insert --scaffold-material--.

UNITED STATES PATENT AND TRADEMARK OFFICE
CERTIFICATE OF CORRECTION

PATENT NO. : 7,153,778 B2
APPLICATION NO. : 10/783843
DATED : December 26, 2006
INVENTOR(S) : Busch et al.

It is certified that error appears in the above-identified patent and that said Letters Patent is hereby corrected as shown below:

Col. 18 line 66, claim 21,
Delete "scaffold material"
Before "consists" and
Insert --scaffold-material--.

Signed and Sealed this

Twenty-eighth Day of August, 2007

JON W. DUDAS
*Director of the United States Patent and Trademark Office*